United States Patent
Murota et al.

[11] Patent Number: 5,977,895
[45] Date of Patent: Nov. 2, 1999

[54] WAVEFORM SHAPING CIRCUIT FOR FUNCTION CIRCUIT AND HIGH ORDER DELTA SIGMA MODULATOR

[75] Inventors: Toshio Murota, Kanagawa; Toshihiko Hamasaki, Yokohama, both of Japan

[73] Assignee: Burr-Brown Corporation, Tucson, Ariz.

[21] Appl. No.: 08/918,954

[22] Filed: Aug. 26, 1997

[30] Foreign Application Priority Data

Sep. 6, 1996 [JP] Japan ................................ 8-236474

[51] Int. Cl.$^6$ ....................................... H03M 3/00
[52] U.S. Cl. ........................................ 341/143; 341/118
[58] Field of Search .................... 341/155, 143, 341/144, 172, 110, 118; 330/75, 83, 78, 82

[56] References Cited

U.S. PATENT DOCUMENTS

| | | | |
|---|---|---|---|
| 4,509,037 | 4/1985 | Harris ........................................ | 340/347 |
| 4,902,982 | 2/1990 | Moore et al. ............................. | 330/85 |
| 5,012,244 | 4/1991 | Wellard et al. .......................... | 341/143 |
| 5,446,405 | 8/1995 | Ikeda ....................................... | 327/362 |
| 5,731,695 | 3/1998 | Shioda et al. ........................... | 323/299 |
| 5,748,534 | 5/1998 | Dunlap et al. ...................... | 365/185.21 |

*Primary Examiner*—Howard L. Williams
*Assistant Examiner*—Peguy JeanPierre
*Attorney, Agent, or Firm*—Cahill, Sutton & Thomas P.L.C.

[57] ABSTRACT

A waveform shaping circuit for use in a function circuit is provided which minimizes interference with a feedback circuit of the function circuit and a load. The waveform shaping circuit disposed in the function circuit includes a voltage transfer unit and a voltage-to-current converter unit. The voltage transfer unit transfers a voltage at an output terminal of an operational amplifier to the converter unit in an electrically isolated condition. The converter unit has a predetermined threshold for the magnitude of the voltage at the output terminal. The converter unit supplies an inverting input terminal of the operational amplifier with a current having a magnitude depending on a relationship in magnitude between the voltage at the output terminal and the predetermined threshold. In one embodiment of the invention the waveform shaping circuit is used to prevent the onset of instability in a high order delta sigma modulator.

22 Claims, 15 Drawing Sheets

OFF STATE

OFF-ON TRANSITION STATE

ON STATE

OFF STATE (PRIOR ART)

OFF-ON TRANSITION STATE

ON STATE

WAVEFORM SHAPING CIRCUIT FOR FUNCTION CIRCUIT AND HIGH ORDER DELTA SIGMA MODULATOR

BACKGROUND OF THE INVENTION

1. Field of the Invention

The present invention relates generally to the field of waveform shaping circuits for performing a clip function, a limit function or any other function, and more particularly to a waveform shaping circuit suitable for use in a function circuit, especially in a delta sigma analog-to-digital converter.

2. Description of Related Art

Electric circuits often employ a variety of waveform shaping circuits including a clip circuit for setting an upper or lower limit of a signal waveform, a limiter circuit composed of a pair of clip circuits for setting both upper and lower limits of a signal waveform, and so on. A known limiter circuit comprises a pair of circuits, each including a diode and a series connected power supply for determining a limit level, connected in parallel with a load coupled between output terminals of a circuit, such that the paired circuits are arranged in parallel with each other with the polarities of their diodes being opposite to each other. To implement a limiter circuit as mentioned above in a semiconductor integrated circuit, diode-connected MOS (metal oxide semiconductor) transistors (hereinafter referred to as the "MOS diode") may be used as the diodes included in the paired circuits. For example, in a function circuit using an operational amplifier, the limiter circuit may be positioned in parallel with a load connected between the output terminal of the operational amplifier and ground, or, in parallel with a feedback circuit from the output terminal to a non-inverting input terminal of the operational amplifier. FIG. 16 illustrates the configuration of the latter circuit having a limiter circuit arranged in parallel with a feedback circuit of an operational amplifier. The illustrated circuit has an input circuit impedance Zin and a feedback circuit impedance Zf and a pair of N-type MOS diodes MD1P and MD2P constituting a limiter circuit as mentioned above is arranged in parallel with the feedback circuit including the feedback circuit impedance Zf. The illustrated limiter has limit levels determined by threshold voltages of the N-type MOS diodes themselves and functions to limit an output voltage of the operational amplifier within a range of a reference voltage (a potential at a non-inverting input terminal of the operational amplifier, for example, ground)± the threshold voltage.

In a limiter used in connection with an operational amplifier as mentioned above, an ON-OFF switching speed of a limiting operation is susceptible to the influence of the impedance of a circuit arranged in parallel with the limiter circuit, i.e., the feedback circuit impedance Zf in the example of FIG. 16. Such parallel impedance may cause a reduced switching speed of the limiter. In addition, an equivalent impedance of the MOS diodes acts on the parallel impedance, i.e., a load impedance or a feedback impedance which would result in changes in the impedance constant. The changes in the constant cause a problem that the function circuit using the operational amplifier derives inaccurate results of the functional operation. Furthermore, since the foregoing limiter is configured to directly limit the output voltage of the operational amplifier, the limiter is required to handle an output voltage having a large load driveability, i.e., a relatively large output current. This requires MOS diodes having a sufficiently large gate width to stand such a large current. However, a larger gate width implies a problem that a larger chip area is required when the MOS diodes are implemented in a semiconductor circuit. The problems associated with the limiter are commonly applied to clip circuits.

Analog-to-digital converters utilizing delta sigma modulators have used delta sigma modulators of orders higher than two because such higher order delta sigma modulators more effectively shift quantization noise to out-of-band frequencies. As disclosed in U.S. Pat. No. 5,012,244 (Wellard et al.) entitled "DELTA-SIGMA MODULATOR WITH OSCILLATION DETECT AND RESET CIRCUIT", extension to higher order delta sigma modulators results in stability problems. FIG. 21 herein labeled "prior art" shows the circuit in FIG. 1 of the Wellard et al. patent, in which the disclosed fourth order delta sigma modulator uses an oscillation comparator 30 to detect the signal at the output of the second integrator which, according to the Wellard et al. disclosure is the first one to approach an instability condition. If such instability condition is detected, the oscillation detect comparator short circuits the output of each of the four integrators to its respective input to thereby reset all four integrators and eliminate any accumulated information therein.

A problem with the circuit disclosed in the Wellard et al. patent is that instability of the delta sigma modulator loop does not necessarily always appear at the output of the second stage of integration 12, to which the input of the "oscillation detect comparator" 30 is connected. Consequently, an instability that occurs at the output of a subsequent integrator in the loop will not be detected. Another problem is that when the switches SW1-4 in FIG. 1 of the Wellard et al. patent close that effectively changes the delta sigma loop into a first order loop and the loop output becomes zero, requiring a considerable amount of time. This constitutes a drastic change in the delta modulator circuit during analog-to-digital conversion, and prevents continuous operation. Furthermore, the circuit required to generate the "oscillation threshold" voltage and the "oscillation detector comparator circuit" 30 will occupy an undesirably large amount of chip area.

U.S. Pat. No. 4,509,037 (Harris) entitled "ENHANCED DELTA MODULATION ENCODER" discloses a clipper circuit which is connected between the input and output of one of the integration stages of a high order delta sigma modulator, which, when large signals are present, shorts out the integrator to change the poles and zeroes and hence the characteristics of the filter system. The circuit for accomplishing this is shown in FIG. 3 of the Harris patent and in reproduced as FIG. 22 herein labeled "prior art". A problem of the circuit disclosed in the Harris patent is that the delta sigma modulator is necessarily changed to a first order delta sigma modulator loop when the singular clipping circuit connected between the input of the second integrator and the output of the Nth integrator (equal to the output of the spectrum tilter) is active, due to a phase lag of the output of the spectrum tilter. Therefore, a drastic change in the delta sigma modulator occurs when the clipping circuit turns on and off, and this prevents continuous operation.

Thus, there is an unmet need for an improved circuit and technique for avoiding instability in various circuits, including higher order delta sigma modulators.

SUMMARY OF THE INVENTION

It is therefore an object of the present invention to provide a waveform shaping circuit for a function circuit which is capable of shaping a waveform with minimum influence on a feedback circuit of the function circuit implemented by an operational amplifier and a load connected thereto as well as having minimum influence on the waveform shaping circuit affected by the feedback circuit and the load.

It is another object of the present invention to provide a waveform shaping circuit for a function circuit which is only required to handle a small current for waveform shaping.

It is another object of the invention to provide a circuit and method for avoiding the problems associated with the instability avoiding circuits and techniques disclosed in U.S. Pat. Nos. 5,012,244 and 4,509,037.

It is another object of the invention to prevent an instability condition from occurring in a high order delta sigma modulator.

It is another object of the invention to provide a simple circuit which avoids problems associated with instability in a high order delta sigma modulator, yet occupies very little chip area.

To achieve the above objects, the present invention provides a circuit for preventing onset of instability in a high order delta sigma modulator which includes a plurality of integrators each including an input circuit, an integrating amplifier having an inverting input and an output, and an integrating capacitor coupled between the inverting input and the output. A feedback circuit has an input coupled to the output of the integrating amplifier and an output coupled to the inverting input of the integrating amplifier, and operates to apply negative feedback from the output to the inverting input in response to a voltage of the output outside of a predetermined range above or a predetermined range below a voltage of the inverting input. The feedback circuit includes first and second waveform shaping circuits for use in a function circuit including an operational amplifier with a non-inverting input terminal, an inverting input terminal, a non-inverting output terminal, and an inverting output terminal. The first waveform shaping circuit is connected to the non-inverting output terminal and inverting input terminal of the operational amplifier. The second waveform shaping circuit is connected to the inverting output terminal and non-inverting input terminal of the operational amplifier. Each of the first and second waveform shaping circuits includes (1) a voltage transfer circuit having an input connected to one of the inverting and non-inverting output terminals of the operational amplifier and an output electrically isolated from the input of the voltage transfer circuit, and is operative to transfer the magnitude of a voltage at the one of the inverting and non-inverting output terminals of the operational amplifier from the input terminal of the voltage transfer circuit to the output thereof in an electrically isolated state, and (2) a voltage-to-current converting circuit having an input connected to the output of the voltage transfer circuit and an output connected to one of the inverting and non-inverting input terminals of the operational amplifier. The voltage-to-current converting circuit has a predetermined threshold for the magnitude of the voltage at the one of the inverting and non-inverting output terminals of the operational amplifier, operative to supply the one of the inverting and non-inverting input terminals thereof with a current having a magnitude depending on a relationship in magnitude between the voltage at the one of the inverting and non-inverting output terminals of the operational amplifier received from the voltage transfer circuit and the predetermined threshold. The waveform shaping circuit includes a limiter circuit composed of a pair of clip circuits. The pair of clip circuits have first and second predetermined thresholds, respectively. The thresholds establish a stable range for the output voltage of the integrating amplifier, so the feedback circuit prevents the output voltage of the integrating amplifier from going significantly above or below the stable range.

The foregoing and other features and advantages of the present invention will be apparent from the following more particular description of preferred embodiments of the invention as illustrated in the accompanying drawings.

BRIEF DESCRIPTION OF THE DRAWINGS

FIG. 4 is an equivalent circuit diagram illustrating the limit circuit (the upper limit circuit only is illustrated) in the function circuit B of FIG. 2 when the limit circuit is transitioning from OFF state to ON.

FIG. 18 is an equivalent circuit diagram illustrating the limit circuit (an upper limit circuit only is illustrated) in the prior art function circuit of FIG. 16 when the limit circuit is transitioning from OFF state to ON.

DESCRIPTION OF THE PREFERRED EMBODIMENTS

Figure 1:
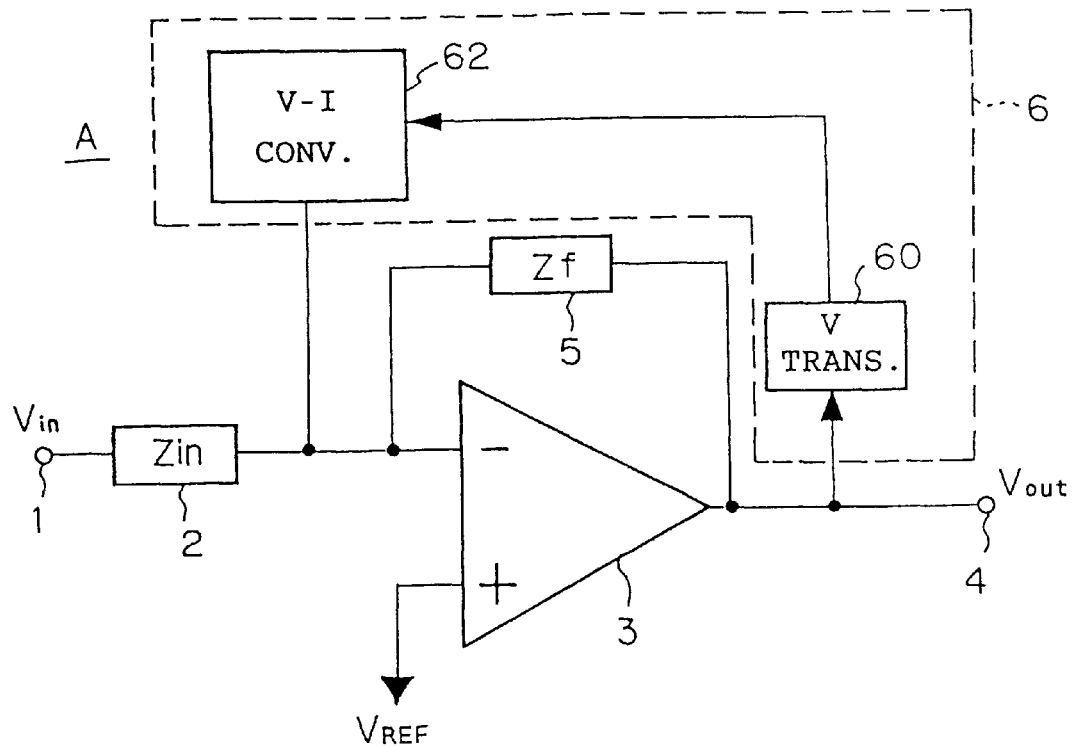
FIG. 1 is a circuit diagram illustrating a function circuit A comprising a waveform shaping circuit according to a first embodiment of the present invention for showing a basic concept of the present invention.

FIG. 1 is a circuit diagram illustrating a function circuit comprising a waveform shaping circuit according to a first embodiment of the present invention. The waveform shaping circuit is illustrated in a block diagram form for representing its basic concept. Specifically, the function circuit A, which is of a generalized type for executing an arbitrary function, comprises an input terminal 1 for receiving an input voltage Vin; an input circuit 2; an operational amplifier 3 having differential inputs and a single output; an output terminal 4 for providing an output voltage Vout; and a feedback circuit 5. The input circuit 2 is connected between the input terminal 1 and an inverting input terminal (−) of the operational amplifier 3, and has an impedance Zin. The operational amplifier 3 has its non-inverting input terminal (+) connected to a reference voltage VREF (for example, a ground potential) and its output terminal connected to the output terminal of the function circuit A. The feedback circuit 5 connects the output terminal of the operational amplifier 3 with the inverting input of the same, and has an impedance Zf. As is well known in the art, the impedances Zin and Zf can be determined in accordance with a desired function.

The function circuit A also comprises a waveform shaping circuit 6 according to the present invention which is connected between the output terminal and the inverting input of the operational amplifier 3 for performing desired waveform shaping on the output Vout which has undergone a functional operation provided by the function circuit A. The waveform shaping circuit 6 comprises a voltage transfer unit 60 and a voltage-to-current converter unit 62. The voltage transfer unit 60 has an input connected to the output terminal of the amplifier 3 and an output terminal connected to the voltage-to-current converter unit 62, and serves to "isolatedly transfer" the output voltage Vout representative of the result of the functional operation to the converter unit 62, or in other words, to transfer the output voltage Vout to the converter unit 62 while electrically isolating the converter unit from the output terminal. The electrical isolation is maintained in direct current as well as in alternating current. The converter unit 62, which receives the isolatedly transferred voltage, has an output terminal connected to the inverting input of the amplifier 3, and functions to supply the inverting input of the amplifier 3 with a current which has a magnitude depending on a relationship in magnitude between the isolatedly transferred voltage and a predetermined threshold VTH. The threshold VTH can be varied in number and level depending on a desired waveform shaping. The threshold VTH is referenced to the reference voltage VREF at the non-inverting input of the amplifier 3. The waveform shaping processing may include, for example, a clip function for setting an upper limit or a lower limit, a limit function for setting both upper and lower limits, and so on.

In the waveform shaping circuit 6 according to the present invention, the transfer unit 60 for electrically isolatedly transferring a voltage isolates the input terminal of the converter unit 62 from a load (not shown) connected to the output terminal 4 and from the feedback circuit 5 to reduce interference between a load impedance and the feedback impedance Zf. The reduced interference can minimize the influence of the load and feedback circuit impedances on the waveform shaping operation. In addition, the provision of the transfer unit 60 enables the voltage-to-current converter unit 62 to utilize a power supply independent of any voltage or current within the function circuit A for the waveform shaping. This is advantageous in increasing the operation speed of the waveform shaping. Furthermore, since the converter unit 62 is configured such that its output terminal is connected to the input terminal side of the operational amplifier 3 instead of the output terminal side, a signal directly subjected to the waveform shaping operation can be a signal before amplified by the amplifier 3. This configuration is advantageous in further increasing the operation speed of the waveform shaping as compared with the operation speed of a waveform shaping performed on a amplified signal. Another advantage provided by the foregoing configuration is to reduce the circuit capability (including the capacity, size, and so on) required of the converter unit 62.

Figure 2:
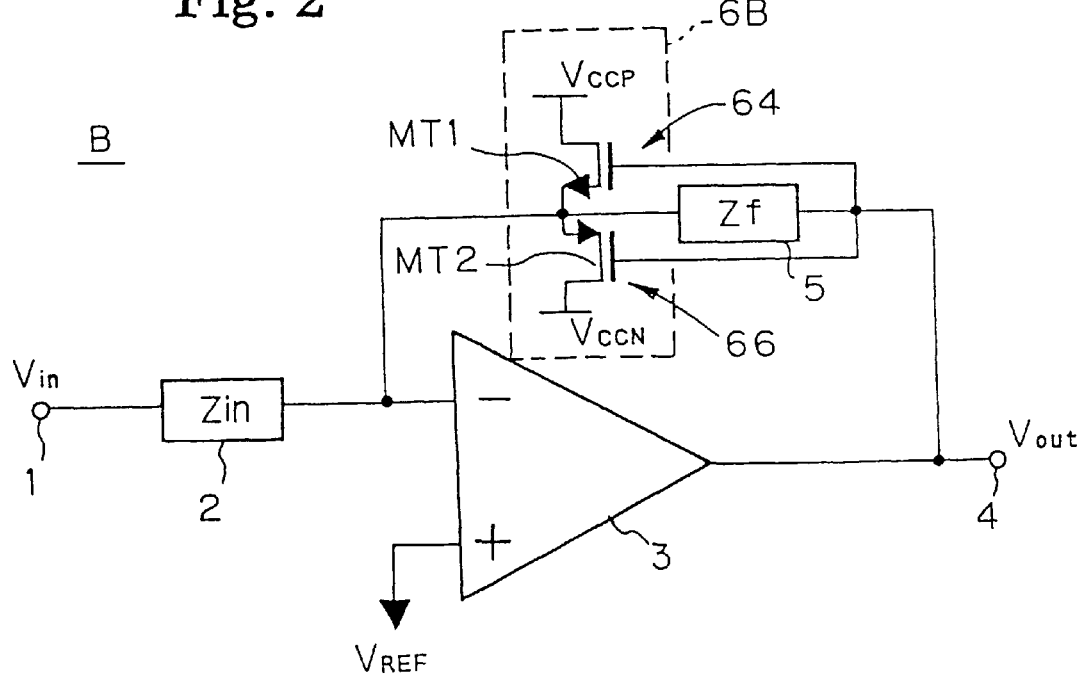
FIG. 2 is a circuit diagram illustrating a function circuit B according to a second embodiment of the present invention which represents a more specific configuration of the function circuit A of FIG. 1.

Next, with reference to FIG. 2, a function circuit B according to a second embodiment of the present invention will be described. It should be noted that the function circuit B represents a more specific configuration of the function circuit A illustrated in FIG. 1, and elements in FIG. 2 similar to those in FIG. 1 are designated the similar reference numerals. This numbering scheme is also applied to the remaining figures. Since the function circuit B illustrated in FIG. 2 is identical to the function circuit A of FIG. 1 except that a more specific waveform shaping circuit 6B is included, the waveform shaping circuit 6B only is described in detail. The shaping circuit 6B comprises a limiter circuit including a pair of limit (or clip) circuits 64 and 66. The limiter circuit 64 for providing an upper limit (or clip) function includes an N-type MOS transistor MT1 which has a drain electrode connected to a positive supply voltage terminal VCCP, a source electrode connected to an inverting input of an operational amplifier 3, and a gate electrode connected to an output terminal 4. The limit circuit 66 for providing a lower limit (or clip) function includes a P-type MOS transistor MT2 which has a source electrode connected to the inverting input of the amplifier 3, a drain electrode connected to a negative supply voltage terminal VCCN, and a gate electrode connected to the output terminal 4. The MOS transistors MT1 and MT2 have threshold voltages VTH1 and VTH2, respectively, for ON-OFF switching. Thus, the limit circuit 6B has an upper limit level VLM1 set at (VREF+VTH1) and a lower limit level VLM2 set at (VREF−VTH2). It should be noted that the threshold voltages of the MOS transistors can be adjusted, for example, by varying a source-substrate voltage. As an example, the threshold voltage may be in a range of 0.6–1.5 volts. It should be noted that this embodiment utilizing the threshold voltages of the MOS transistors for setting upper and lower limit levels is suitable for a reduction in size of the circuit because additional elements are not required for setting the threshold values.

Here, explaining a correspondence between the limiter circuit 6B and the waveform shaping circuit 6 of FIG. 1, a gate electrode and underlying oxide of each of the MOS transistors MT1 and MT2 correspond to the voltage transfer unit 60, and a voltage from the transfer unit 60 is transferred to a source-substrate junction immediately below the oxide of each of the MOS transistors MT1 and MT2. The remaining portion of each of the MOS transistors MT1 and MT2 corresponds to the converter unit 62. A threshold set within the converter unit 62 is defined by the source-substrate junction immediately below the oxide of the MOS transistor MT1. Thus, the limiter circuit 6B provides an implementation of the waveform shaping circuit 6.

Figure 3:
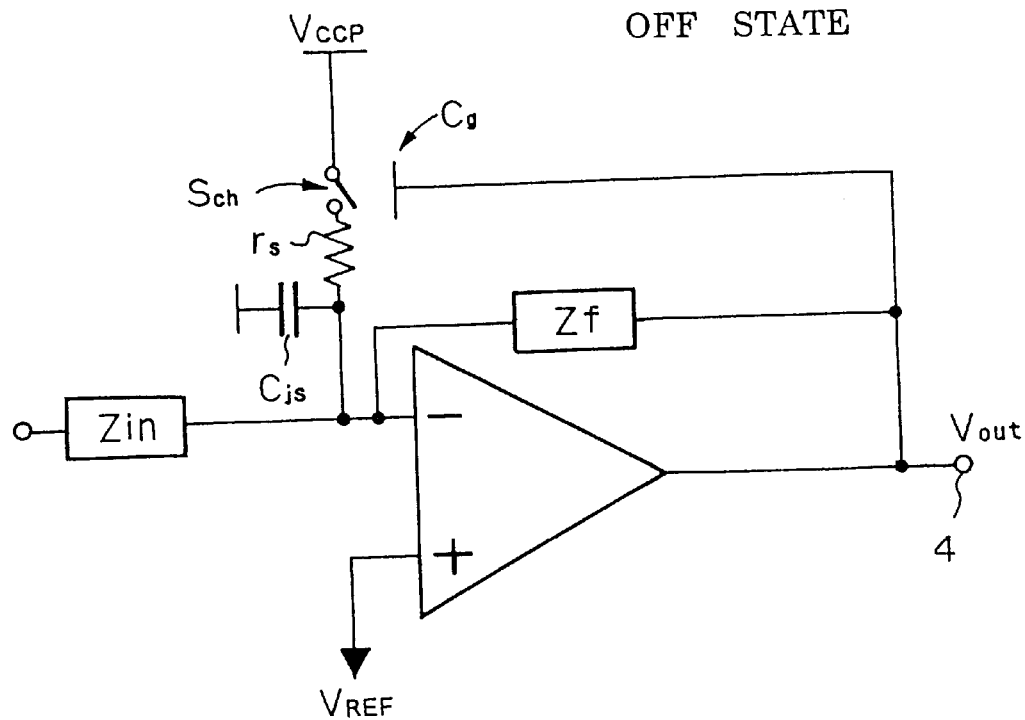
FIG. 3 is an equivalent circuit diagram illustrating a limit circuit (an upper limit circuit only is illustrated) in the function circuit B of FIG. 2 when the limit circuit is in OFF state.
Figure 4:
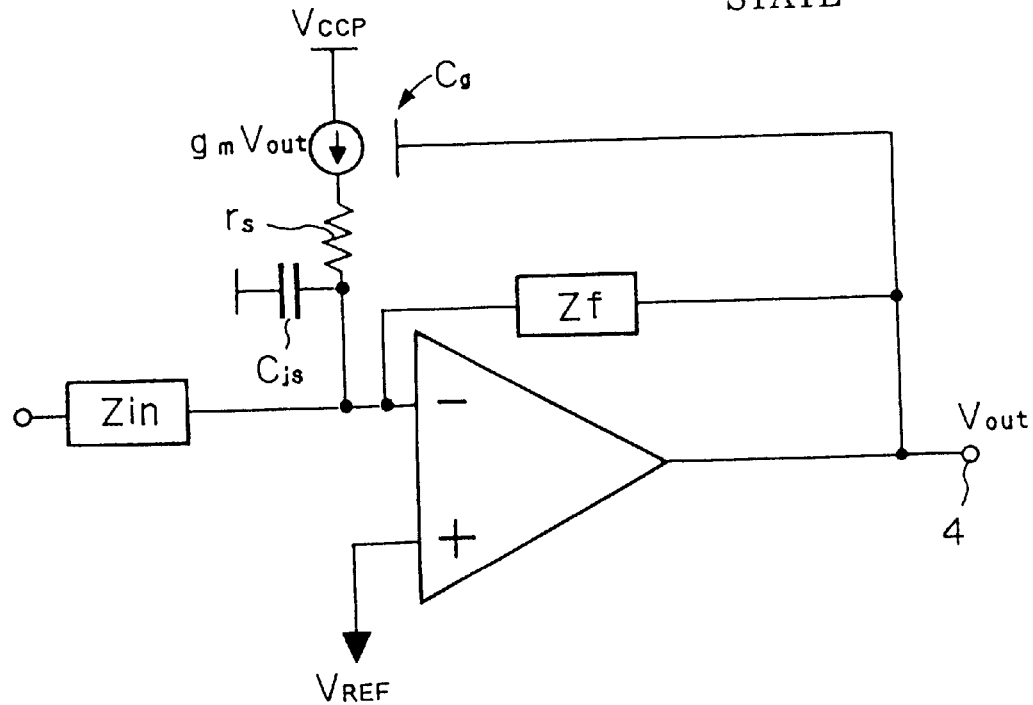
Figure 5:
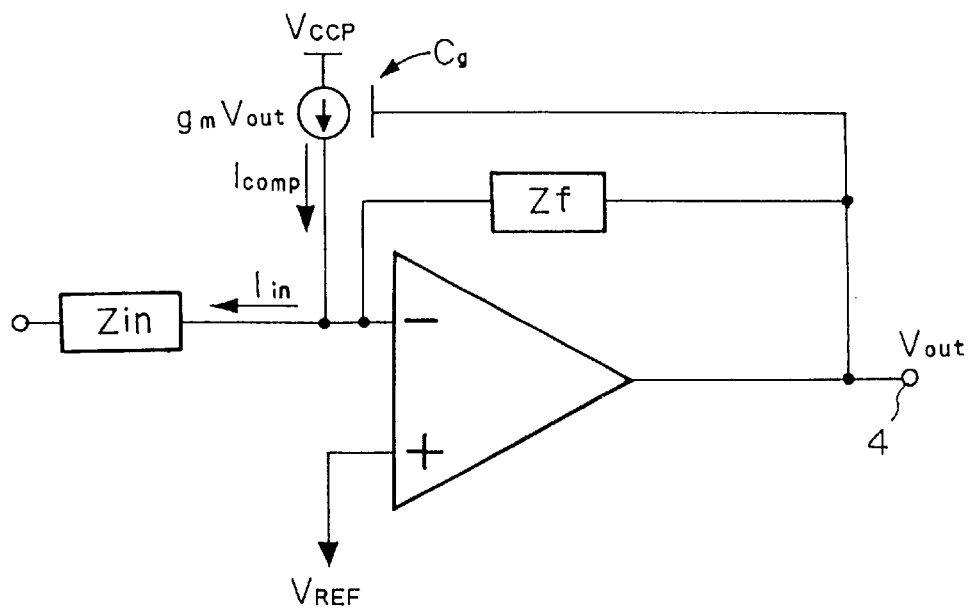
FIG. 5 is an equivalent circuit diagram illustrating the limit circuit (the upper limit circuit only is illustrated) in the function circuit B of FIG. 2 when the limit circuit is in ON state.

Next, with reference to FIGS. 3–5 illustrating equivalent circuits of the function circuit B, the operation of the limiter circuit 6B will be described. It should be noted that since the upper and lower limit circuits 64 and 66 operate in a similar manner, FIGS. 3–5 only illustrate equivalent circuits of the upper limit circuit. Specifically, FIG. 3 shows the upper limit circuit 64 in OFF state, FIG. 4 in OFF-to-ON transition state; and FIG. 5 in ON state. In the illustrated circuits, a MOS transistor has a transconductance gm, a MOS gate capacitance Cg (including capacitances for all of a drain, a source, and a substrate), a switch Sch realized by a channel resistance of the MOS transistor, a source resistance rs, and a source-substrate junction capacitance Cjs.

Referring first to FIG. 3, it shows an OFF-state equivalent circuit of the function circuit B. The upper limit circuit 64 may be regarded as comprising the channel switch Sch and the source resistance rs connected in series between the supply voltage terminal VCCP and the inverting input, the gate capacitance Cg having one end connected to an output terminal 4 and the other end conceptually illustrated to be associated with the channel switch Sch but representing an isolated condition, and the source-substrate junction capacitance Cjs connected between the non-inverting input and the substrate. In this event, i.e., when Vout<VLM1 stands, the channel switch Sch is open (i.e., the channel resistance is infinitely large), so that a limit operation does not occur.

Referring next to FIG. 4, it shows an OFF-ON transition state equivalent circuit of the function circuit B. FIG. 4 is identical to FIG. 3 except that the channel switch Sch is replaced with a current source gmVout, and Cg is associated with the current source gmVout. In the transition state, the channel is in a conductive state so that the current source is connected to the inverting input through rs and Cjs.

Figure 6:
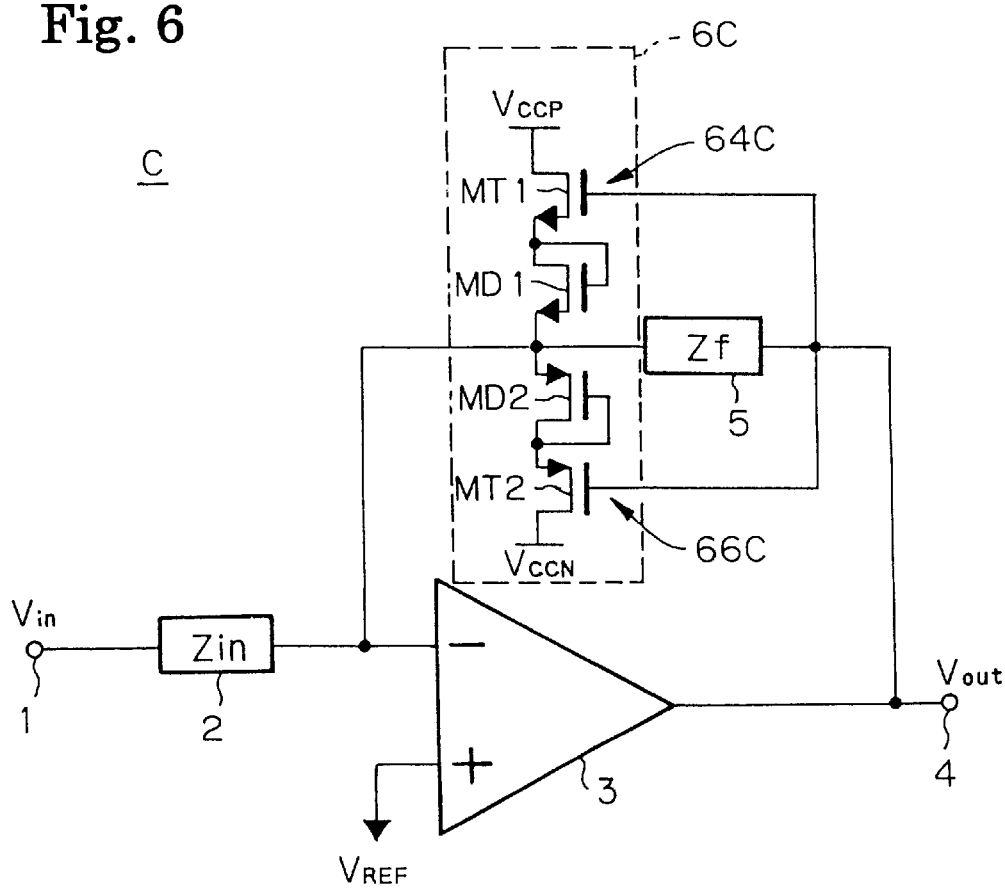
FIG. 6 is a circuit diagram illustrating a function circuit C according to a third embodiment of the present invention which represents a more specific configuration of the function circuit A of FIG. 1.
Figure 16:
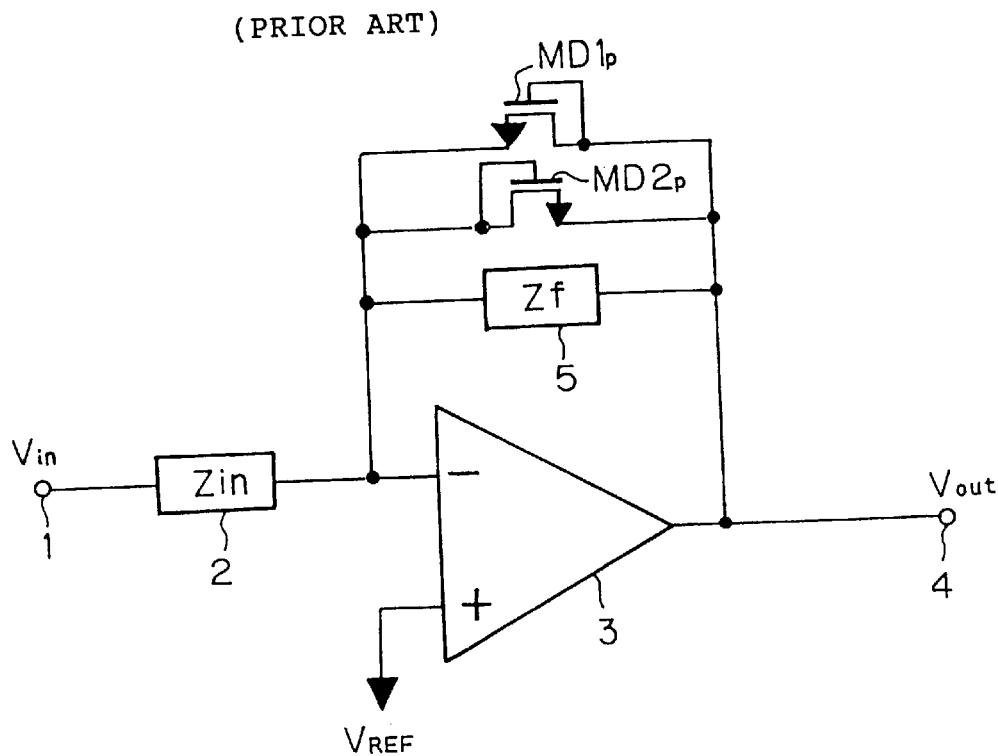
FIG. 16 is a circuit diagram illustrating a prior art function circuit having a limiter.
Figure 17:
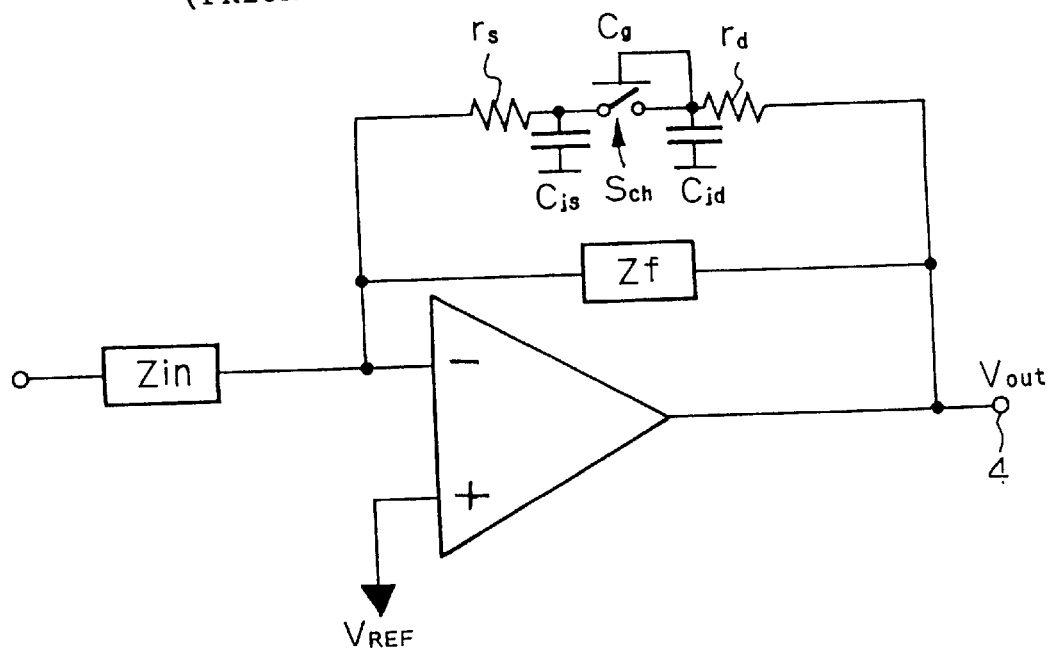
FIG. 17 is an equivalent circuit diagram illustrating the limit circuit (an upper limit circuit only is illustrated) in the prior art function circuit of FIG. 16 when the limit circuit is in OFF state.
Figure 18:
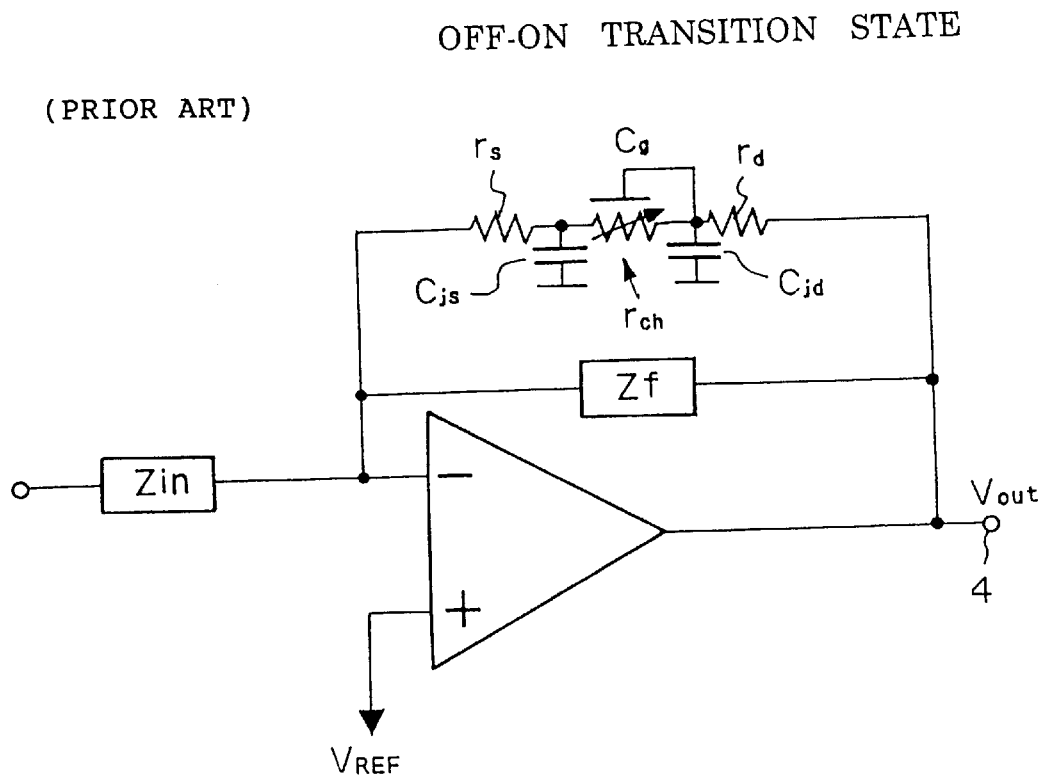
Figure 19:
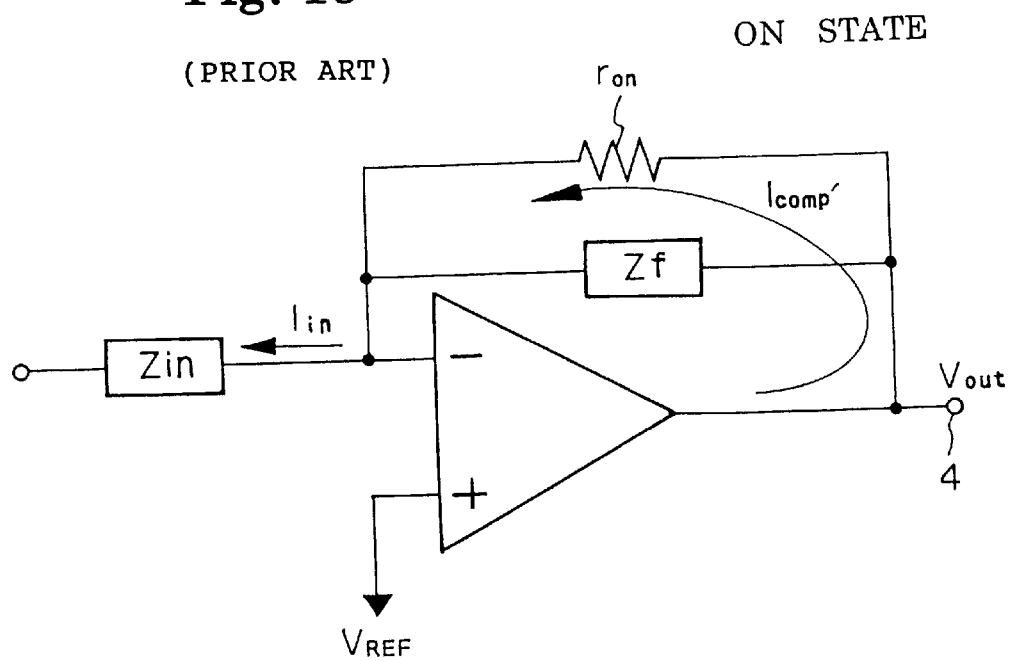
FIG. 19 is an equivalent circuit diagram illustrating the limit circuit (an upper limit circuit only is illustrated) in the prior art function circuit of FIG. 16 when the limit circuit is in ON state.

Referring next to FIG. 5 showing an ON-state equivalent circuit of the function circuit B, rs and Cjs become small enough to be ignored with respect to a current flowing therethrough, so that the current source gmVout is directly connected to the inverting input. Therefore, the current source gmVout supplies the inverting input with a compensation current Icomp having a magnitude proportional to an output voltage Vout to offset an excessively increased portion of an input current Iin. Now, for more clearly understanding the features of the limiter circuit 6B included in the function circuit B of the present invention shown in FIG. 2, reference is made to FIGS. 17–19 showing equivalent circuits of the prior art circuit of FIG. 16. For facilitating comparison between the present invention and the prior art, FIGS. 17–19 also illustrate equivalent circuits of only the upper limit circuit comprising a MOS diode MD1P in FIG. 16 in OFF state (FIG. 17), in OFF-ON transition state (FIG. 18), and in ON state (FIG. 19). In the equivalent circuits, the MOS diode has a drain resistance rd; a drain-substrate junction capacitance Cjd; a channel resistance rch; an ON resistance ron which is equal to the sum of rs, rd and rch. It should be noted that since a MOS diode connection is employed, a current source such as gmVout of the present invention does not exist. First, comparing FIG. 3 with FIG. 17, both illustrating the equivalent circuits in OFF state, since the switches Sch in both circuits are open, the equivalent circuits are equivalent although rd and Cjd are added between the output terminal 4 and the inverting input terminal in FIG. 17. Next, comparing FIG. 4 with FIG. 18, both illustrating the equivalent circuits in OFF-ON transition state, the channel switch Sch is replaced with the channel resistance rch in FIG. 18. The channel resistance rs is the largest of all resistances including rs and rd. The capacitance Cjd in turn has a magnitude equal to or larger than twice the gate capacitance Cg. Thus, rch and Cjd influence a turn-on settling time in the prior art circuit. On the other hand, the circuit of the present invention shown in FIG. 4 does not include Cjd or rch, resulting in a shorter turn-on settling time. Finally, comparing FIG. 5 with FIG. 19, both illustrating the equivalent circuits in ON state, a compensation current Icomp' is supplied through a parallel connection of ron and Zf and moreover by the operational amplifier in the prior art circuit of FIG. 19, whereas a compensation current Icomp is supplied by a current source independent of the operational amplifier and directly to the non-inverting input in the circuit of the present invention of FIG. 5. Thus, in contrast to the prior art circuit in which the magnitude of the compensation current Icomp' depends on the current supplying capability of the employed operational amplifier, the present invention is free from such limitation on the compensation current Icomp. In addition, since the path of the compensation current Icomp does not include Zf or is intervened by the ON resistance ron in the present invention, an operating speed can be increased. It should be appreciated from the foregoing description that the circuit of the present invention shown in FIG. 2 has various advantageous over the prior art circuit shown in FIG. 16. FIG. 6 shows a function circuit C according to a third embodiment of the present invention which is a more specific configuration of the function circuit A shown in FIG. 1. Since the circuit C is identical to the circuit B shown in FIG. 2 except that a limit circuit 6C is a modification of the limit circuit 6B in FIG. 2, the circuit portion different from FIG. 2 will be particularly described. The limit circuit 6C is intended to set an upper limit level VLM1 to a higher level and a lower limit level VLM2 to a lower level. For this purpose, upper and lower limit circuit 64C and 66C are additionally provided with MOS diodes MD1 and MD2, respectively. More specifically, an N-type MOS diode is connected between a source electrode of a MOS transistor MT1 and an inverting input terminal of an operational amplifier 3, while a P-type MOS diode is connected between the inverting input terminal and a source electrode of a MOS transistor MT2. Assuming that ON voltages of the MOS diodes MD1 and MD2 are VON1 and VON2, respectively, the upper limit level VLM1 of the limiter circuit 6C is defined by (VREF+VTH1+VON1), and the lower limit level VLM2 is defined by (VREF−VTH2−VON2).

A correspondence between the limiter circuit 6C and the waveform shaping circuit of FIG. 1 is such that gate electrodes and underlying oxides of the MOS transistors MT1 and MT2 correspond to the voltage transfer unit 60, and the remaining portions of the transistors MT1 and MT2 and the MOS diodes MD1 and MD2 correspond to the converter unit 62. Thus, the limiter circuit 6C provides another implementation of the waveform shaping circuit 6.

While in the embodiment illustrated in FIG. 6, each of the limit circuits is additionally provided with one MOS diode, two or more MOS diodes may be added thereto as required. In addition, different numbers of MOS diodes may be added to the upper and lower limit circuits, respectively, if such a need arises.

Figure 7:
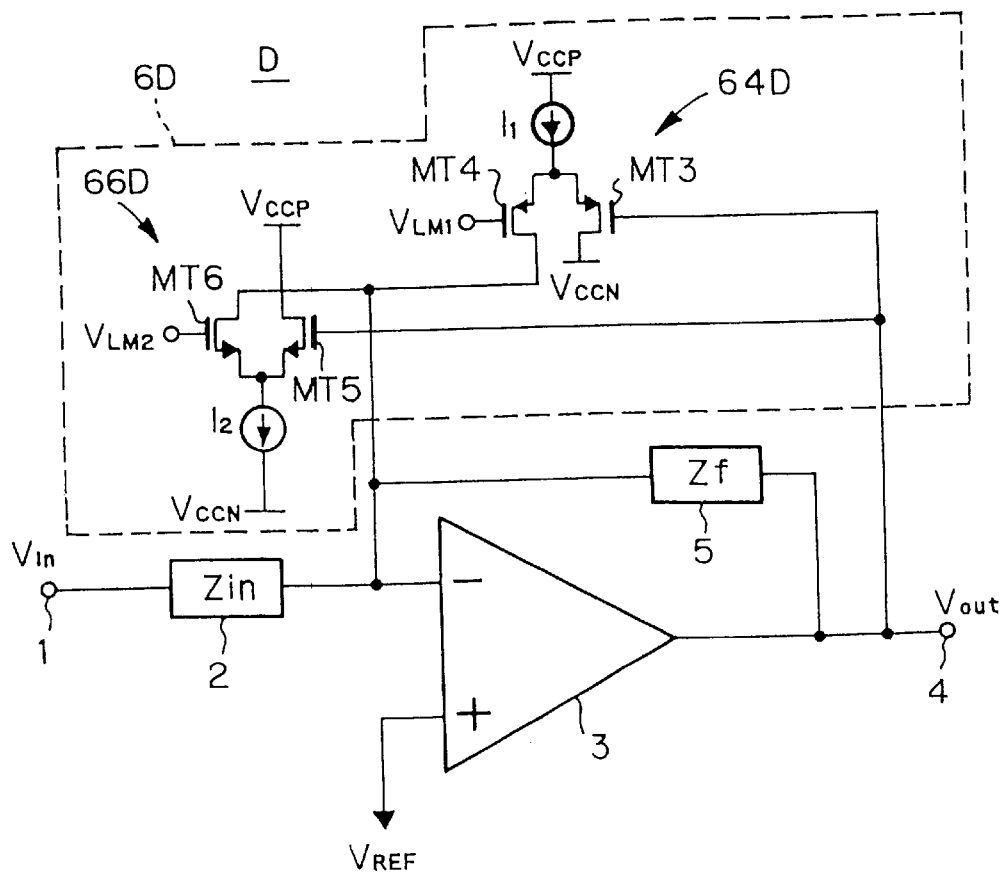
FIG. 7 is a circuit diagram illustrating a function circuit D according to a fourth embodiment of the present invention which represents another more specific configuration of the function circuit A of FIG. 1.

FIG. 7 shows a function circuit D according to a fourth embodiment of the present invention which is a more specific version of the function circuit A shown in FIG. 1. Since the circuit D is identical to the circuit B shown in FIG. 2 except that a limit circuit 6D is a modification of the limiter circuit 6B in FIG. 2, the circuit portion different from FIG. 2 will be particularly described. The limit circuit 6D is intended to more freely and more easily set upper and lower limit levels. For this purpose, a current switch is included in each of upper and lower limit circuits 64D and 66D. More specifically, the upper limit circuit 64D comprises a current source I1 and a pair of P-type MOS transistors MT3 and MT4. The current source I1 is connected between a positive supply voltage terminal VCCP and source electrodes of the MOS transistors MT3 and MT4. The MOS transistor MT3 has a drain electrode connected to a negative supply voltage terminal VCCN and a gate electrode connected to an output terminal 4. The MOS transistor MT4, in turn, has a drain electrode connected to an inverting input of an operational amplifier 3 and a gate electrode connected to an upper limit level (VLM1) terminal. This current switch opens a first current path for conducting current from the current source I1 to the VCCN supply terminal when Vout≦VLM1 stands, and opens a second current path for conducting current from the current source I1 to the inverting input when Vout>VLM1 stands. Similarly, the lower limit circuit 66D comprises a pair of N-type MOS transistors MT5 and MT6 and a current source I2. The MOS transistor MT5 has a drain electrode connected to the positive source voltage terminal VCCP and a gate electrode connected to the output terminal 4. The MOS transistor MT6, in turn, has a drain electrode connected to the inverting input and a gate electrode connected to a lower limit level (VLM2) terminal. The current source I2 is connected between source electrodes of the respective MOS transistors MT5 and MT6 and the negative supply voltage terminal VCCN. This current switch opens a first current path for drawing current of the current source I2 from the VCCP supply voltage terminal when Vout≧VLM2 stands, and opens a second current path for drawing current of the current source I2 from the inverting input when Vout<VLM2 stands.

A correspondence between the limiter circuit 6D of FIG. 7 and the waveform shaping circuit 6 of FIG. 1 is such that the gate electrodes and underlying oxides of the respective MOS transistors MT3 and MT5 within the pair of current switches correspond to the voltage transfer unit 60, and all the remaining portions of the current switches correspond to the converter unit 62. Thus, the limiter circuit 6D also provides a further implementation of the waveform shaping circuit 6.

Figure 8:
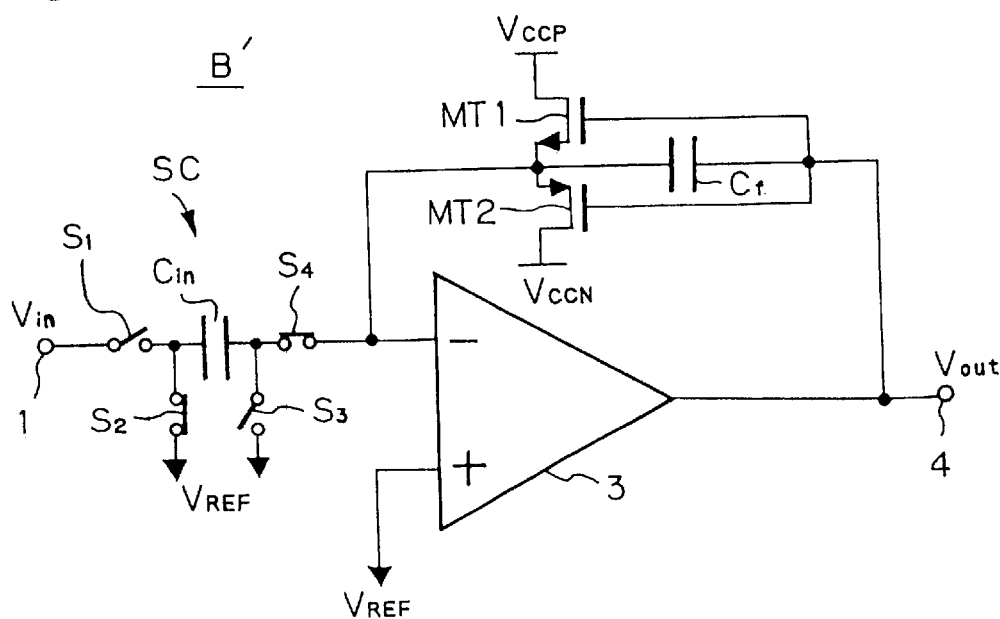
FIG. 8 is a circuit diagram illustrating a switched capacitor type integrator circuit B' which represents a more specific configuration of the function circuit B of FIG. 2.
Figure 9:
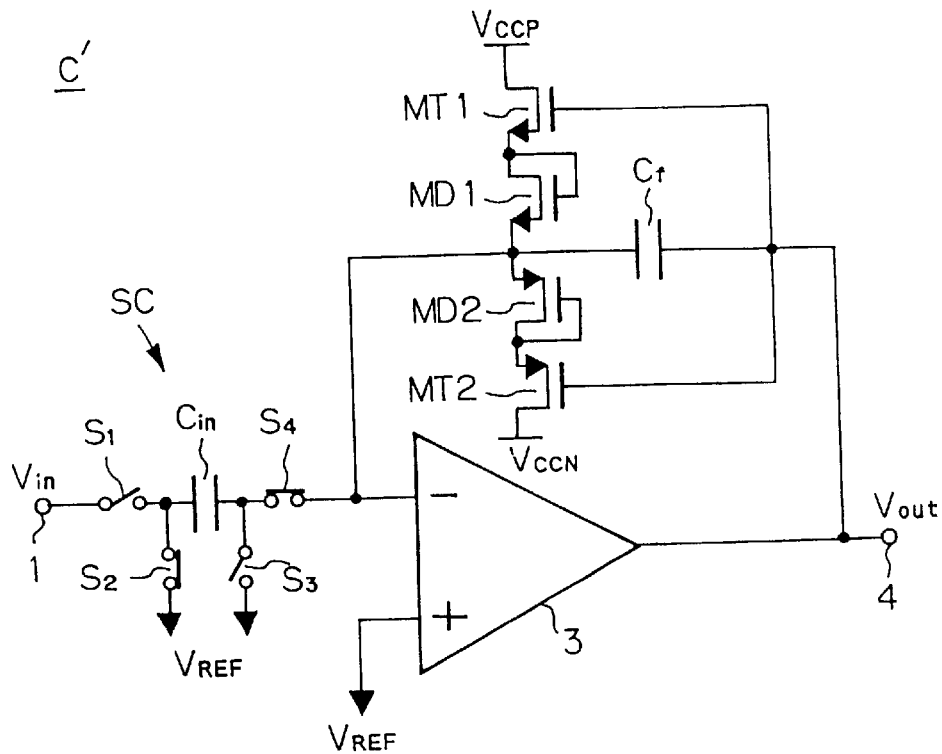
FIG. 9 is a circuit diagram illustrating a switched capacitor type integrator circuit C' which represents a more specific configuration of the function circuit C of FIG. 6.
Figure 10:
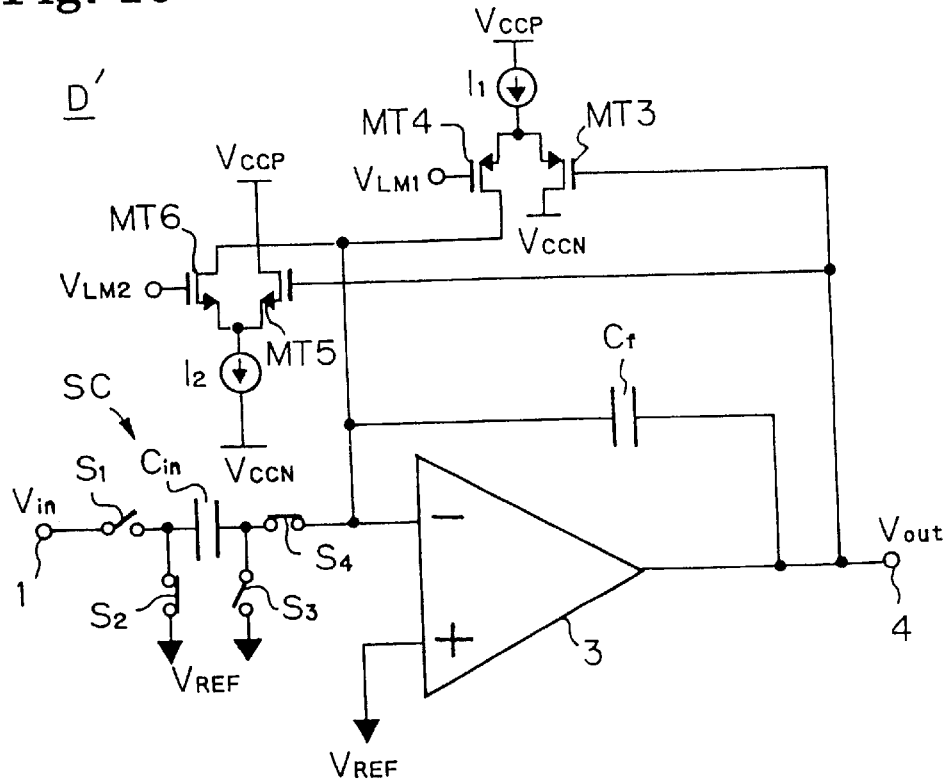
FIG. 10 is a circuit diagram illustrating a switched capacitor type integrator circuit D' which represents a more specific configuration of the function circuit D of FIG. 7.

Next, with reference to FIGS. 8–10, integrator circuits B', C' and D', which are more specific implementations of the function circuits B, C and D, will be described. The integrator circuits B', C' and D' constitute switched capacitor type integrator circuits, and differ from the corresponding function circuits B, C and D in that a switched capacitor SC is used as an input circuit Zin, and a capacitor Cf is used as a feedback circuit Zf. The switched capacitor SC has a known configuration and comprises analog switches S1 and S2 connected in series between an input terminal 1 and a reference voltage VREF; an input capacitor Cin and an analog switch S3 connected in series between a junction of the analog switches S1 and S2 and the reference voltage VREF; and an analog switch S4 connected between a junction of Cin and S3 and an inverting input, as illustrated. As can be seen, the analog switches S1 and S3 are driven by a clock φ1, while the analog switches S2 and S4 are driven by a clock φ2 which is complementary to the clock φ1.

Figure 11:
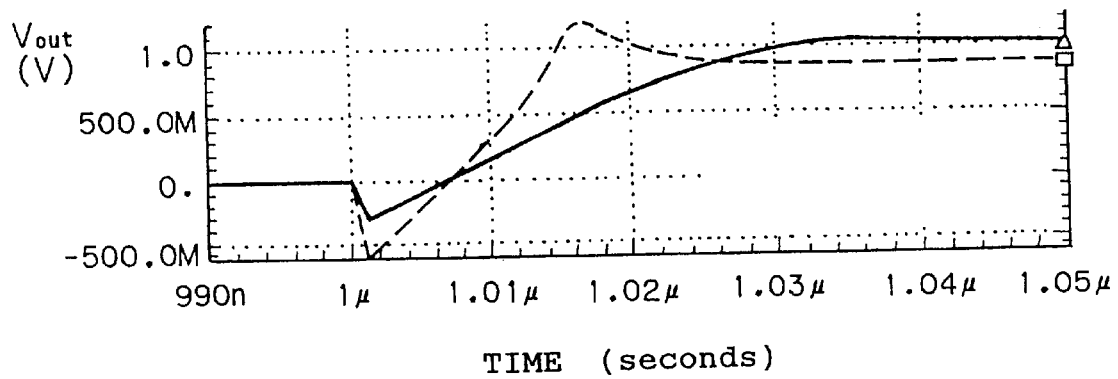
FIG. 11 is a graph representing a turn-on characteristic of the limiter within the integrator circuit B' of FIG. 8, where a solid line indicates the characteristic of a prior art circuit shown in FIG. 20 and a broken line indicates the characteristic of the circuit according to the present invention for comparison.
Figure 12:
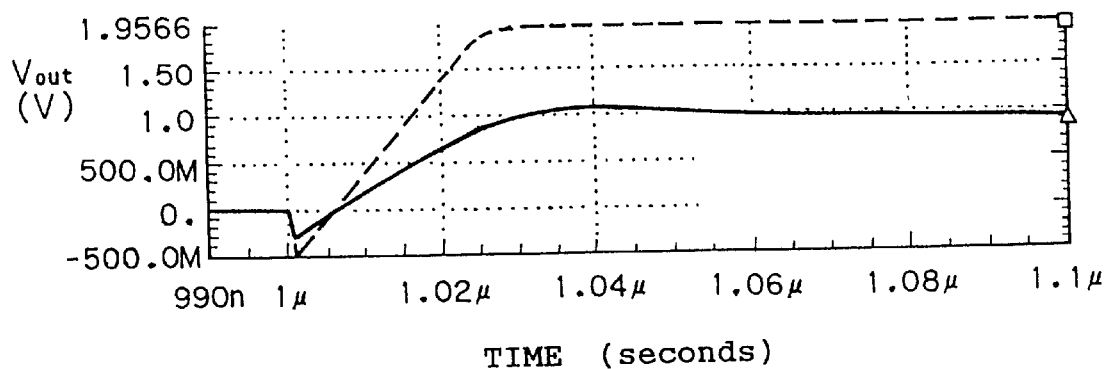
FIG. 12 is a graph representing a turn-on characteristic of the limiter within the integrator circuit C' of FIG. 9, where a solid line indicates the characteristic of the prior art circuit of FIG. 20 and a broken line indicates the characteristic of the circuit according to the present invention for comparison.
Figure 20:
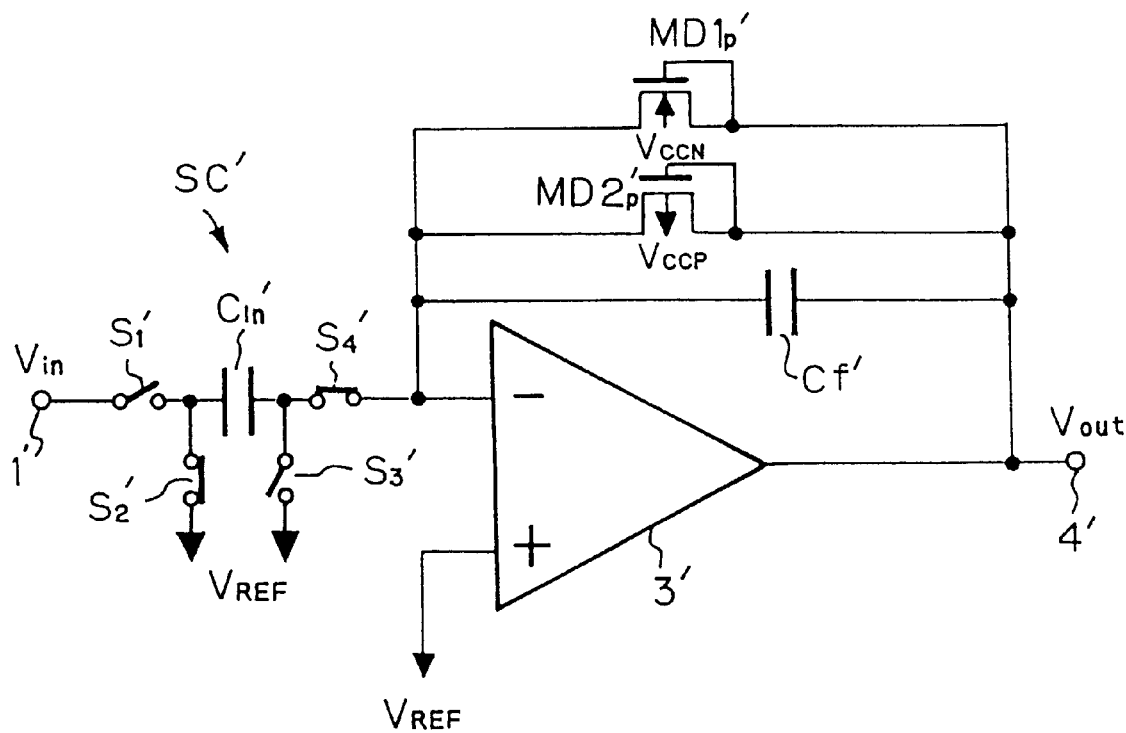
FIG. 20 is a circuit diagram illustrating a capacitor type integrator circuit having the prior art circuit structure of FIG. 16 for comparison with circuits according to the present invention.
Figure 21:
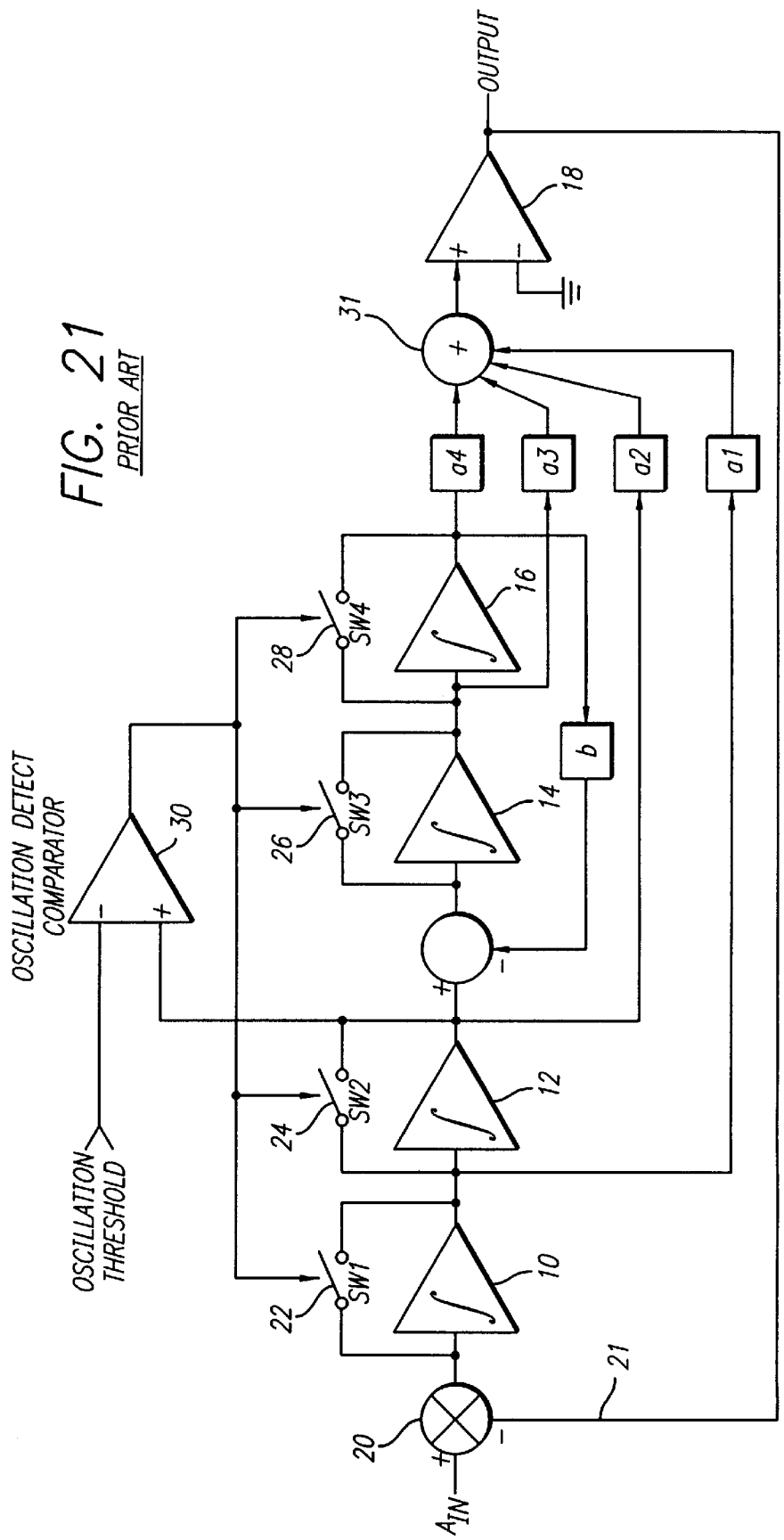
FIG. 21 is a circuit diagram illustrating a prior art fourth order delta sigma modulator shown in FIG. 1 of U.S. Pat. No. 5,012,244.
Figure 22:
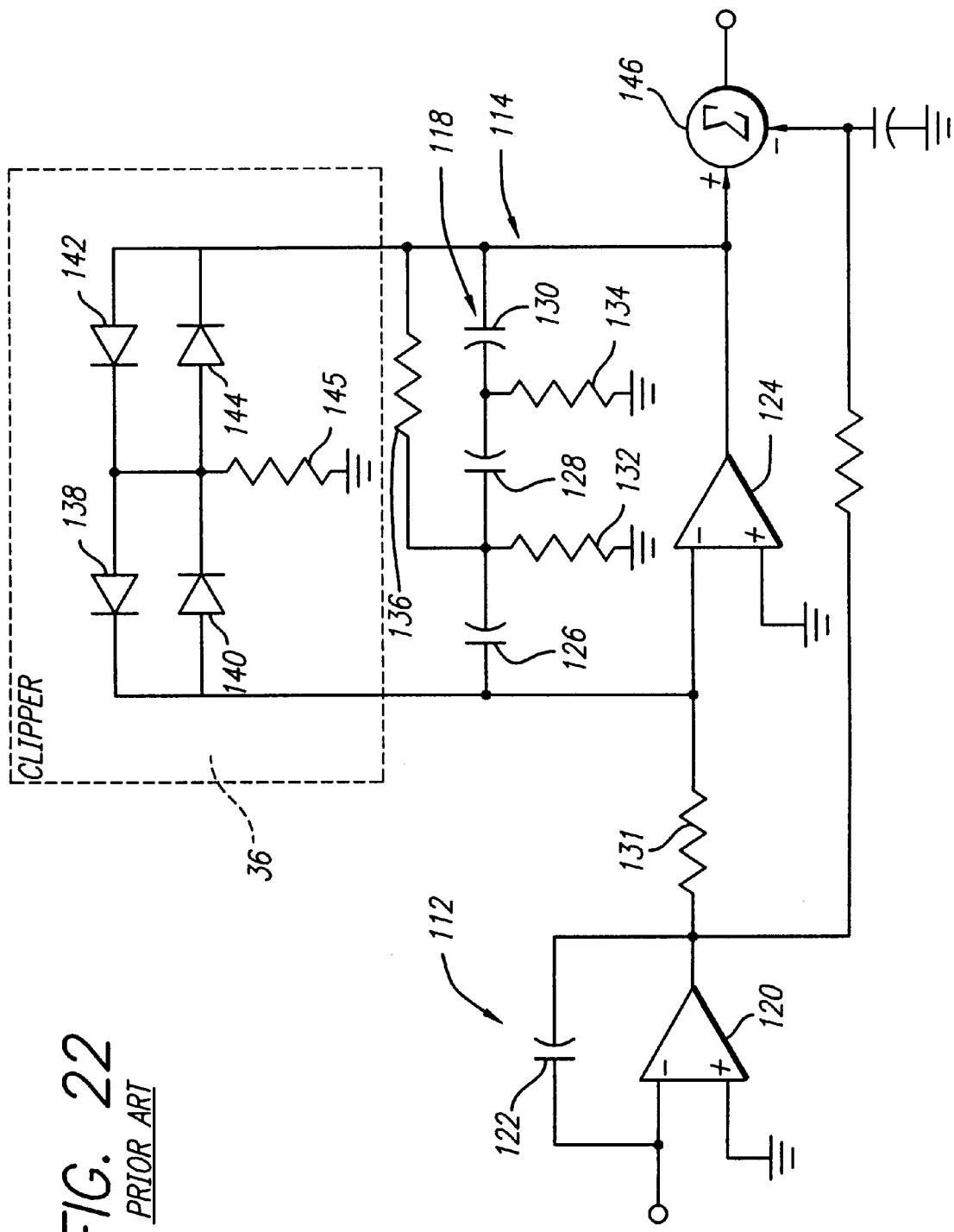
FIG. 22 is a circuit diagram illustrating a feedback circuit for limiting instability in a high order delta sigma modulator as shown in FIG. 3 of U.S. Pat. No. 4,509,037.

Next, referring to FIGS. 11–13, the turn-on characteristics of the limiters within the integrator circuits B', C' and D' will be explained. It should be noted that the turn-off characteristics of the integrator circuits B', C', D' are similar to the turn-on characteristics, so that explanation of the turn-off characteristics is omitted. Specifically, FIG. 11 illustrates the turn-on characteristic of the integrator circuit B'; FIG. 12, that of the integrator circuit C'; and FIG. 13, that of the integrator circuit D'. In addition, the respective graphs of FIGS. 11–13 include the turn-on characteristic of the prior art circuit shown in FIG. 20 for comparison. The prior art circuit of FIG. 20 employs the prior art circuit configuration of FIG. 16 to realize a switched capacitor type integrator circuit. In simulations for producing the characteristic graphs, the following values were used:

VCCP: 2.9 volts;
VCCN: −2.1 volts;
VREF: ground;
Cin, Cin': 1 pF;
Cf, Cf': 1 pF;
MT1: W/L=200 µm/0.6 µm;
MT2: W/L=400 µm/0.6 µm;
MD1: W/L=200 µm/0.6 µm;
MD2: W/L=400 µm/0.6 µm;
MT3, MT4: W/L=400 µm/0.6 µm;
MT5, MT6: W/L=200 µm/0.6 µm; and
I1, I2: 100 microamperes.

where W/L represents a ratio of the gate width to the gate length of a MOS transistor.

The simulation was made under condition that Cin has been completely charged at 1 microsecond on the respective characteristic graphs, and the switches S2 and S4 are turned on by the clock φ2 at 1 microsecond. In the respective characteristic graphs, broken line curves represent the characteristics of the circuits according to the present invention, and solid line curves represent the characteristics of the prior art circuit.

As seen from FIG. 11, the integrator circuit B' of the present invention has a larger slew rate, as compared with the prior art circuit, and the limiter circuit settles after the switching at approximately 1.025 microseconds, resulting in a shorter settling time. The output Vout of the prior art circuit is still lowering even at 1.05 microseconds and has not yet settled. It should be noted however that a limit level of the circuit of the present invention is set at approximately 0.85 volts while that of the prior art circuit is set at approximately 1.0 volt. The improved slew rate of the present invention is attributed to a reduced influence of the limiter circuit of the present invention on the feedback circuit of the integrator circuit or a load. Also, the reduction in time for complete settling is achieved due to a reduced influence of the feedback circuit of the integrator circuit or the load exerting on the limiter circuit of the present invention and due to the arrangement in that the current source independent of the output of the operational amplifier acts on limit operation.

Also, as can be seen in FIG. 12, a similar improvement in slew rate and a reduced time for complete settling of the output Vout is achieved by the present invention. Specifically, while the output Vout of the circuit according to the present invention settles at approximately 1.03 microseconds, the output Vout of the prior art circuit has not yet settled even at 1.1 microseconds. It should be noted however that a limit level of the circuit of the present invention is set at approximately 1.9 volts.

Figure 13:
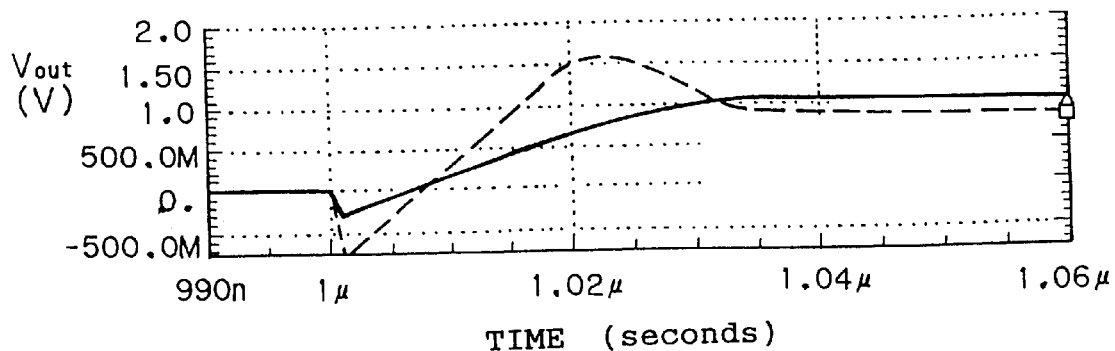
FIG. 13 is a graph representing a turn-on characteristic of the limiter within the integrator circuit D' of FIG. 10, where a solid line indicates the characteristic of the prior art circuit of FIG. 20 and a broken line indicates the characteristic of the circuit according to the present invention for comparison.

A similar improvement in slew rate and a reduced time for complete settling of the output Vout are also achieved, as can be seen in FIG. 13. Specifically, the output Vout of the prior art circuit has not yet settled even at 1.06 microseconds (at 1.1 microseconds in FIG. 12), whereas the output Vout of the circuit of the present invention has settled at approximately 1.05 microseconds.

Figure 14:
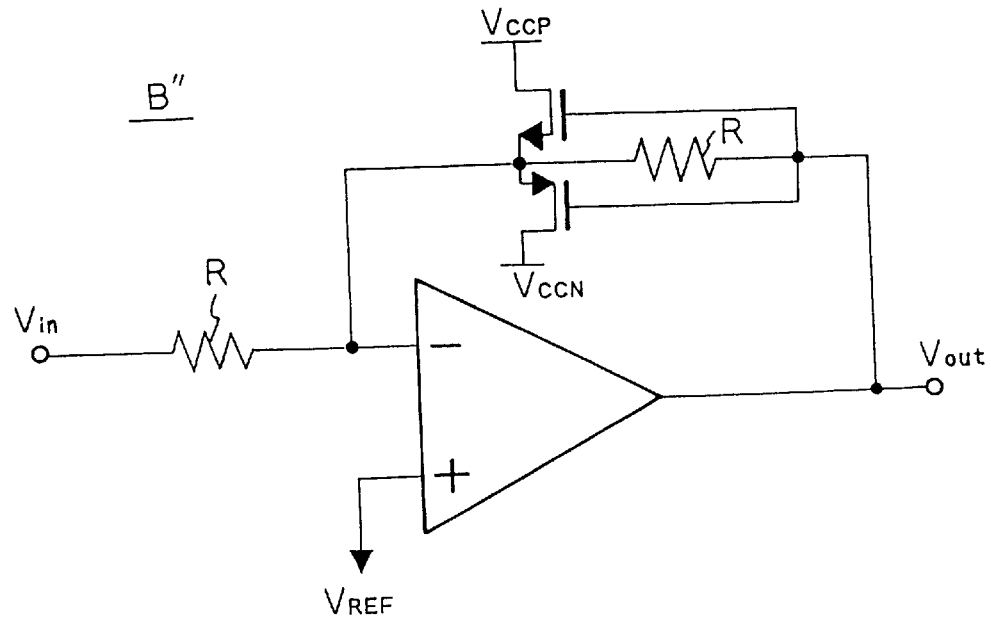
FIG. 14 is a circuit diagram illustrating an inverting amplifier B" which is a specific configuration of the function circuit B of FIG. 2.

While several embodiments of the function circuit according to the present invention have been shown and discussed above, a variety of modifications may also be made to the embodiments as described below. First, while a limiter circuit has been shown as a waveform shaping circuit in the respective embodiments, the limiter circuit may be replaced with a clip circuit only by removing one of the upper and lower limit circuits. Second, while integration has been illustrated as an example of functional operation in the respective embodiments, any combination of the input circuit impedance Zin and the feedback circuit impedance Zf can be selected to perform any other functional operation than inversion and integration, for example, summation, subtraction, multiplication, division, differentiation, logarithm, inverse logarithm, and so on. As an example, FIG. 14 shows an inverting amplifier B" which is a more specific embodiment of the function circuit B of FIG. 2, where Zin is a resistance R and Zf is a resistance R.

Figure 15:
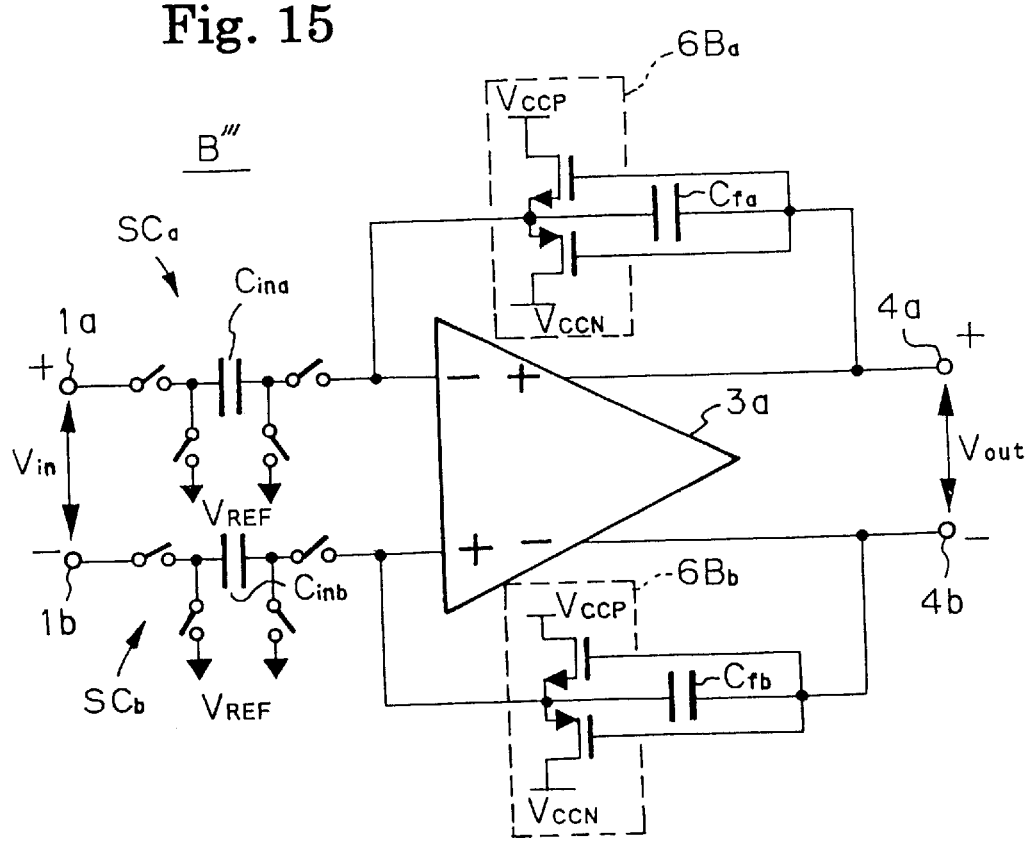
FIG. 15 is a circuit diagram illustrating a switched capacitor type integrator circuit B'" which is a modification of the circuit B' of FIG. 8 and has differential inputs and differential outputs.

Third, while the aforementioned embodiments have been described in connection with a function circuit having differential inputs and a single output, the embodiments can be modified to have differential inputs and differential outputs. As an example, FIG. 15 illustrates a switched capacitor type integrator circuit B''' which is a modification of the circuit B' of FIG. 8 and which has differential inputs and differential outputs. The illustrated circuit comprises positive and negative input terminals 1a and 1b; positive and negative output terminals 4a and 4b; an operational amplifier 3a having differential inputs and differential outputs; a pair of switched capacitors Sca and SCb; a limiter circuit 6Ba and a feedback capacitor Cf1 connected between a non-inverting output terminal and an inverting input terminal of the amplifier; and a limiter circuit 6Bb and a feedback capacitor Cfb connected between an inverting output terminal and a non-inverting input terminal of the amplifier. Fourth, in the embodiments of the differential inputs/single output configuration, an input and a feedback circuit to the inverting input terminal of the operational amplifier may be changed to an input and feedback circuit to the non-inverting input terminal.

According to the waveform shaping circuit for a function circuit of the present invention described above, a voltage transfer unit for isolatedly transferring a voltage reduces interference with a load and a feedback circuit Zf. The reduction in interference minimizes the influence of the load and feedback circuit impedances on shaping operation. This results in improved slew rate of the function circuit and reduced settling time of the shaping operation. In addition, a voltage-to-current converter unit further reduces the settling time of the shaping operation. The reduced settling time enables a high speed function circuit to provide an output representative of the result of a functional operation with reduced errors. Further, since the voltage-to-current converter unit is connected to the input side of the operational amplifier, a relatively low circuit capability is required to the converter unit.

Figure 23:
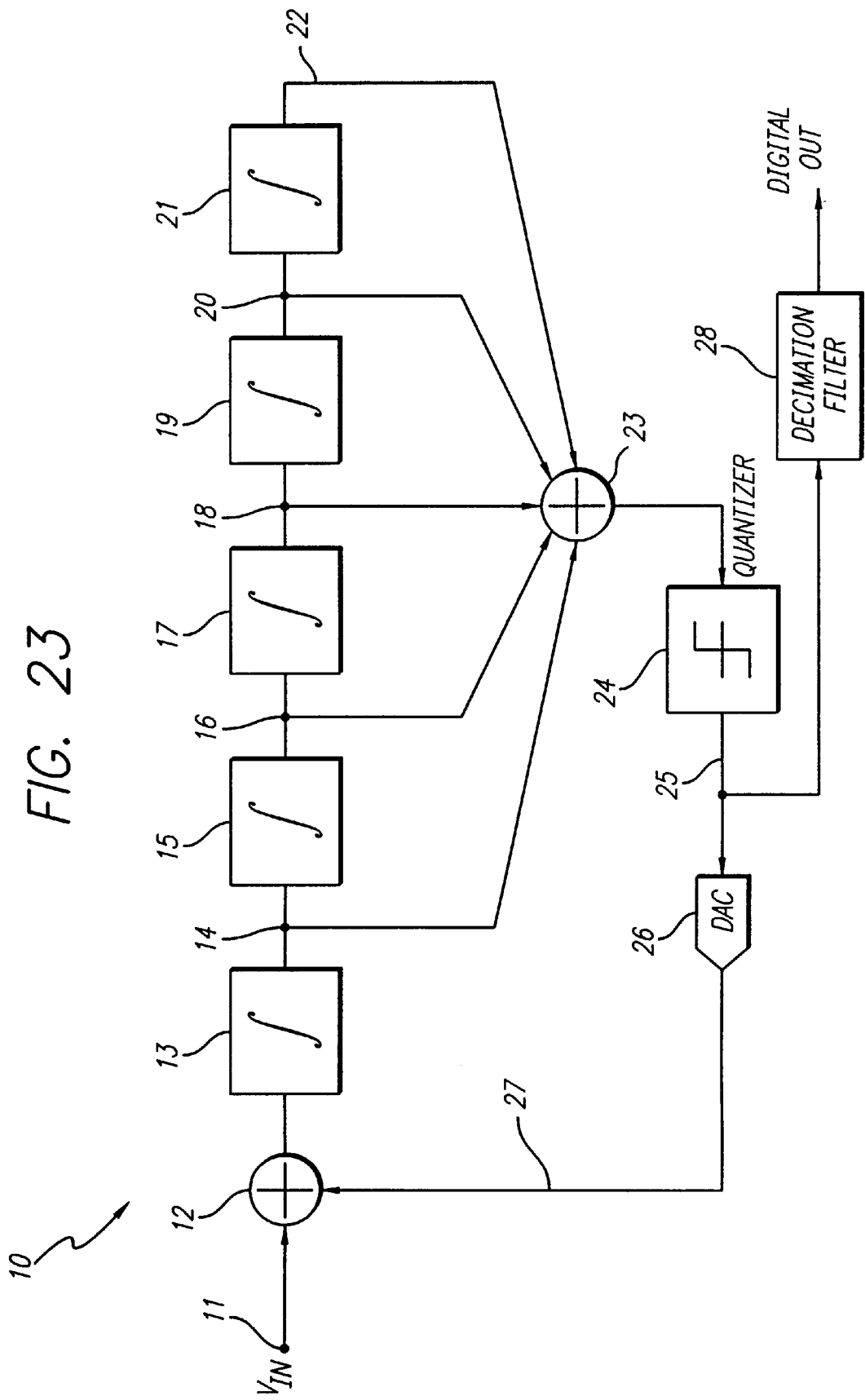
FIG. 23 is a block diagram of a fifth order delta sigma modulator.

Referring next to FIG. 23, an analog-to-digital converter 10 which incorporates the present invention provides an analog input $V_{IN}$ on conductor 11 which is connected to a summing junction 12. The output of the summing junction 12 is connected to the input of a first integrator 13. Integrator 13 and the other four integrators 15, 17, 19 and 21 all have the circuit configuration shown in FIG. 24 (subsequently described) to provide feedback which prevents an instability condition from occurring on any of the conductors 14, 16, 18, 20 or 22. The output of integrator 13 is connected by conductor 14 to the input of second integrator 15 and to a summing junction 23. The output of integrator 15 is connected by conductor 16 to the input of a third integrator 17 and summing junction 23. The output of integrator 17 is connected by conductor 18 to the input of integrator 19 and to summing junction 23. The output of integrator 19 is connected by conductor 20 to the input of integrator 21 and to summing junction 23, and the output of integrator 21 is connected to summing junction 23. The output of summing junction 23 is connected to the input of a quantizer 24, which can be a one bit comparator. The output of quantizer 24 is connected by conductor 25 to the input of a one bit digital-to-analog converter 26 and to the input of a decimation filter 28. Decimation filter 28 produces a digital output signal which represents the analog input signal $V_{IN}$. The output of one bit DAC 26 is connected by conductor 27 to summing junction 12.

Figure 24:
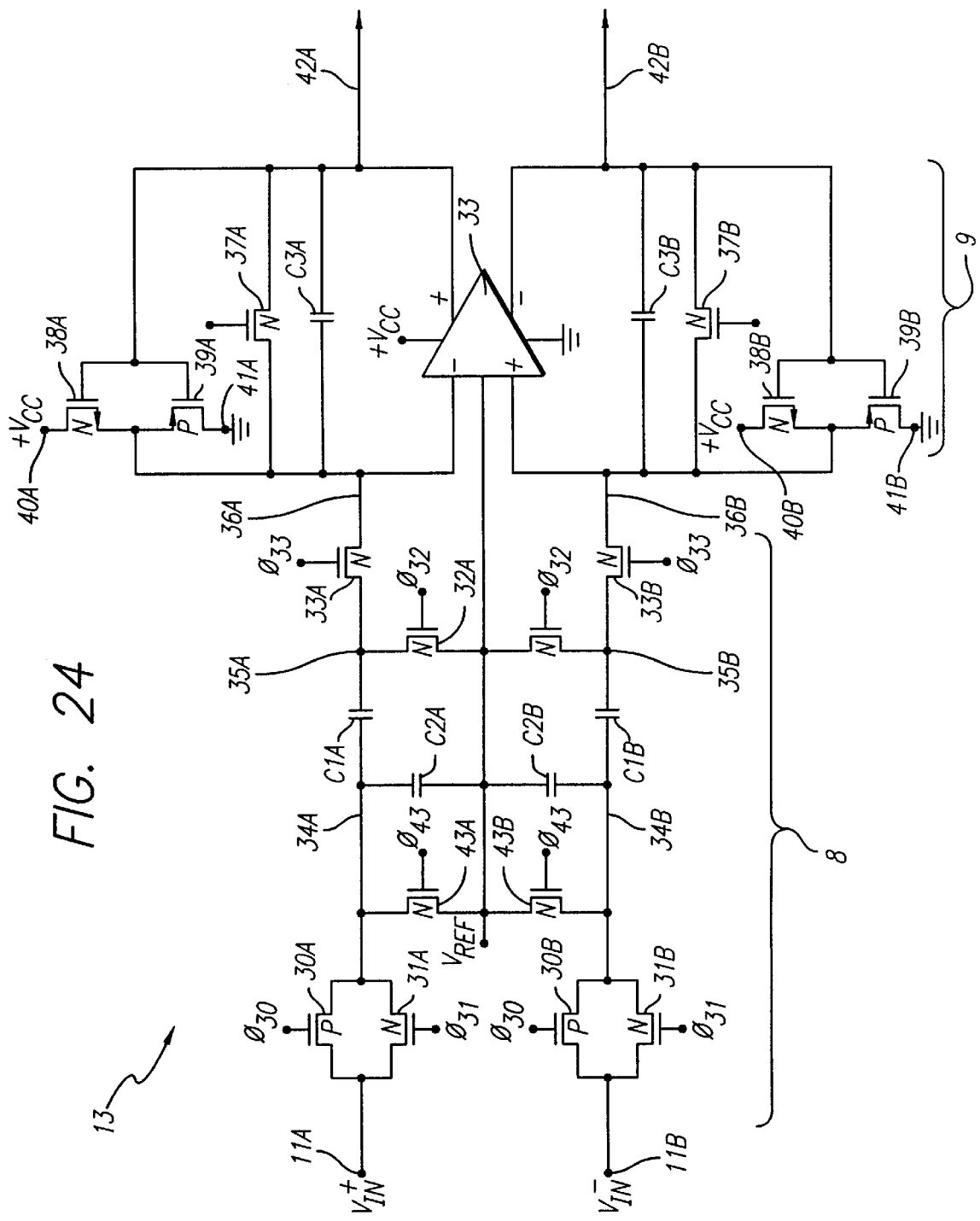
FIG. 24 is a detailed diagram of the circuits of the five integrators used in the delta sigma modulator of FIG. 23 to prevent the onset of an instability condition.

Referring to FIG. 24, the structure of the first integrator 13 of FIG. 23 is illustrated. The remaining integrators also have this same basic circuit structure, although the various switch sizes and capacitance values may be different for the various integrators. Integrator 13 includes a switched capacitor circuit 8 and an integrating amplifier 9 having its inputs coupled to the outputs of switched capacitor circuit 8. A differential analog input voltage equal to the difference between $V_{IN}^+$ and $V_{IN}^-$ is applied between input conductors 11A and 11B. Conductor 11A is connected to the sources of P-channel MOSFET 30A and N-channel MOSFET 31A. The drains of MOSFETs 30A and 31A are connected by conductor 34A to one terminal of N-channel MOSFET 43A and to one plate of each of capacitors C1A and C2A. The gate electrode of MOSFET 30A is connected to φ30 and the gate electrode of MOSFET 31A is connected to φ31. The second terminal of MOSFET 43A is connected to a reference voltage $V_{REF}$. The second plate of capacitor C2A is connected to $V_{REF}$. The control electrode of MOSFET 43A is connected to φ43. The second terminal of capacitor C1A is connected by conductor 35A to one terminal of N-channel MOSFET 32A, the other terminal of which is connected to $V_{REF}$. The gate of MOSFET 32A is connected to φ32. Conductor 35A also is connected to one terminal of N-channel MOSFET 33A, the other terminal of which is connected by conductor 36A to the inverting input of a comparator 33. Conductor 36A also is connected to one plate of a feedback capacitor C3A, the other plate of which is connected to a+output 42A of amplifier 33. N-channel MOSFET 37A, which has its current-carrying terminals connected between conductors 36A and 42A, is used for resetting the integrator. (This function, though essential, is not related to the present invention.)

Figure 25:
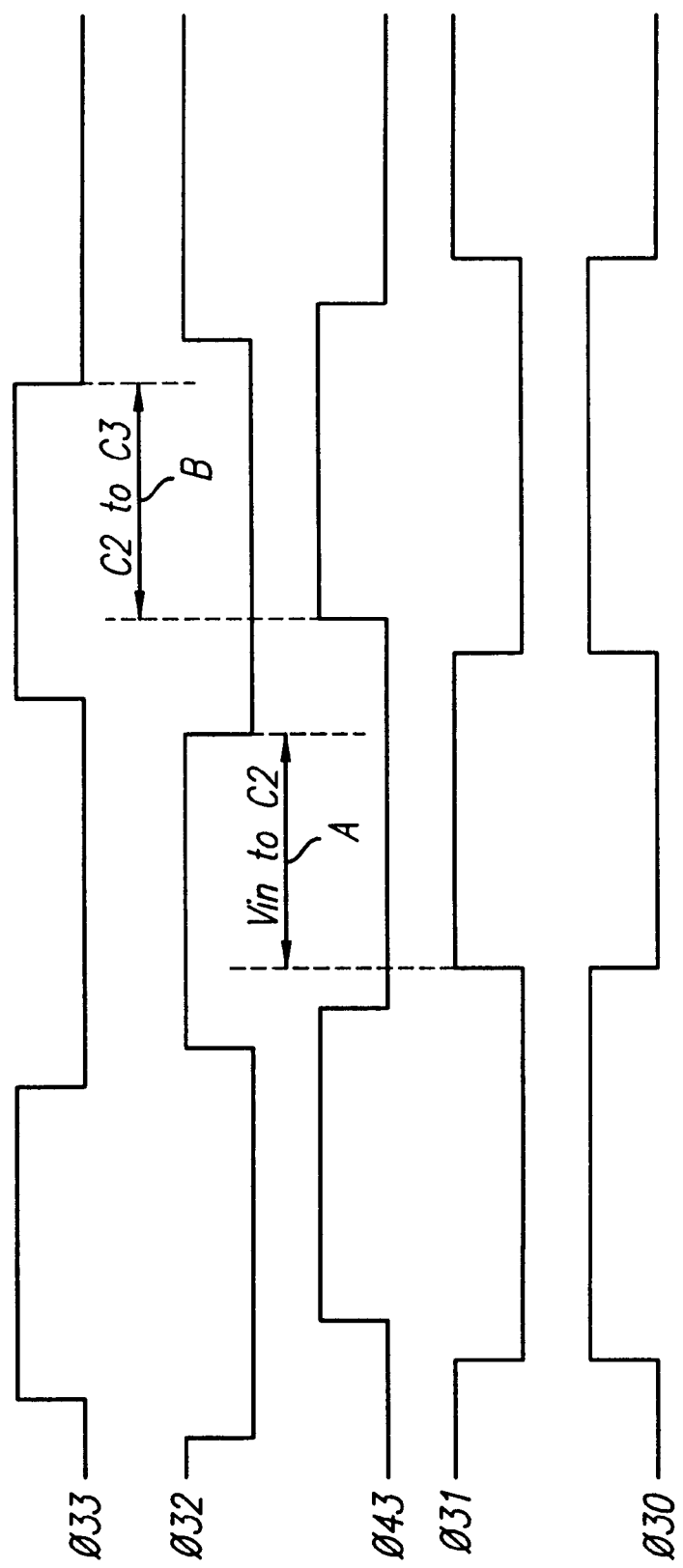
FIG. 25 is a timing diagram illustrating the various clock signals for the circuit of FIG. 24.

The timing diagram of FIG. 25 shows the various clock/control signals required by the integration circuit shown in FIG. 24. During the interval "A" charge is transferred from $V_{IN}^+$ to C2A and from $V_{IN}^-$ to C2B. During the interval "B" charge is transferred from C2A to C3A and from C2B to C3B.

In accordance with the present invention, conductor 36A also is connected to the source electrodes of N-channel MOSFET 38A and P-channel MOSFET 39A. The gate electrodes of MOSFETs 38A and 39A are connected to conductor 42A. The drain electrode of N-channel MOSFET 38A is connected by conductor 40A to a reference voltage, which could be $+V_{CC}$. The drain electrode of P-channel MOSFET 39A is connected by conductor 41A to a second reference voltage, which could be ground. The reference voltage $V_{REF}$ is applied to amplifier 33 to establish the bipolar zero level of the differential input signal.

The above recited connection of elements beginning with $V_{IN}^+$ conductor 11A and continuing to the inverting input of amplifier 33 is identical to the connection of elements beginning with $V_{IN}^-$ conductor 11B and extending to the non-inverting input of amplifier 33, wherein letters "A" have been replaced by "B".

In accordance with the present invention, if the magnitude of the output voltage $V_{42A}$ on output conductor 42A of operational amplifier 33 exceeds the threshold voltage of one of the feedback MOSFETs 38A or 39A to be "overcome", to thereby turn either of them on, a negative feedback current flows through that MOSFET 38A or 39A into or out of conductor 36A. That tends to prevent further changes in the output voltage $V_{42A}$ on conductor 42A which could produce an instability condition. Similarly, MOSFETs 38B and 39B detect the onset of an instability condition of the voltage $V_{42B}$ on amplifier output conductor 42B and generate a compensating negative feedback current which flows into or out of conductor 36B and tends to prevent any instability condition from occurring in the voltage $V_{42B}$ on output conductor 42B.

Note that the above described combinations of N-channel and P-channel MOSFETs 38A and 39A and N-channel and P-channel MOSFETs 38B and 39B do not form CMOS inverter configurations, because the source electrodes, rather than the drain electrodes, are connected to provide the feedback signals on conductors 36A and 36B, and because the drain electrodes, rather than the source electrodes, are connected to the reference voltage conductors $V_{CC}$ and ground, opposite to the configuration of a CMOS inverter. Therefore, the function of the feedback MOSFETs 38A,39A and 39B,39B is to provide feedback currents into "virtual ground" nodes 36A and 36B as described above. For example, if a (−) current flows into conductor 36A, the output voltage on conductor 42A increases, and when the voltage difference between conductors 36A and 42A exceeds the threshold voltage of N-channel MOSFET 38A causing it to turn on, the current flows from the $+V_{CC}$ voltage on conductor 40A into conductor 36A. This current direction is opposite to direction of the input current into inverting input conductor 36A, which means that negative feedback occurs. Similarly, if (+) current flows into virtual ground node 36B, the analogous operation establishes the negative feedback from conductor 42B to the (+) input of amplifier 33.

Such use of feedback to limit the output voltages on conductors 42A and 42B suppresses any instability or oscillation before it occurs, and thereby tends to stabilize the delta sigma modulation loop shown in FIG. 23. This operation can occur in each of the five integrators of the delta sigma modulator to ensure the needed stabilization.

Specifically, if the voltage $V_{42A}$ exceeds the voltage $V_{36A}$ on conductor 36A by more than the threshold voltage $V_{TN}$ of N-channel MOSFET 38A, then MOSFET 38A begins supplying current into conductor 36A. This tends to increase the voltage $V_{36A}$, which causes amplifier 33 to tend to prevent $V_{42A}$ from further increasing. Similarly, if $V_{42A}$ falls more than the P-channel threshold voltage $V_{TP}$ below $V_{36A}$, then MOSFET 39A begins drawing current out of conductor 36A. This causes amplifier 33 to tend to prevent $V_{42A}$ from going any lower. Thus, the threshold-detecting P-channel MOSFET 39A and N-channel MOSFET 38A connected as shown provide feedback which prevents either positive-going or negative-going instability of the voltage on conductor 42A. The operation of MOSFETs 38B and 39B is entirely similar.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention.

What is claimed is:

1. A waveform shaping circuit for use in a function circuit, said function circuit including an operational amplifier having a non-inverting input terminal, an inverting input terminal, a non-inverting output terminal, and an inverting output terminal, said waveform shaping circuit comprising:

(A) first waveform shaping circuit connected to said non-inverting output terminal and said inverting input terminal; and (B) second waveform shaping circuit connected to said inverting output terminal and said non-inverting input terminal, each of said first and second waveform shaping circuits comprising:

(a) voltage transfer means having an input connected to one of said inverting and non-inverting output terminals of said operational amplifier and an output electrically isolated from said input of said voltage transfer means, said voltage transfer means being operative to transfer the magnitude of a voltage at said one of said inverting and non-inverting output terminals of said operational amplifier from said input terminal of said voltage transfer means to said output of said voltage transfer means in an electrically isolated state; and (b) a voltage-to-current converting circuit having an input connected to said output of said voltage transfer means and an output connected to one of said inverting and non-inverting input terminals of said operational amplifier, said converting circuit having a predetermined threshold for the magnitude of the voltage at said one of said inverting and non-inverting output terminals of said operational amplifier, said converting circuit being operative to supply said one of said inverting and non-inverting input terminals of said operational amplifier with a current having a magnitude depending on a relationship in magnitude between the voltage at said one of said inverting and non-inverting output terminals of said operational amplifier received from said voltage transfer means and said predetermined threshold wherein said waveform shaping circuit comprises a limiter circuit composed of a pair of clip circuits, said pair of clip circuit of said limiter circuit having first and second predetermined thresholds, respectively, said first and second predetermined thresholds being different from each other.

2. A waveform shaping circuit according to claim 1, wherein said waveform shaping circuit comprises a clip circuit.

3. A waveform shaping circuit according to claim 3, wherein:
said function circuit includes first and second supply voltage terminals;
said clip circuit including a MOS transistor; and
said MOS transistor having a gate electrode connected to said output terminal of said operational amplifier, and a drain electrode to source electrode path connected to a predetermined one of said first and second supply voltage terminals and said input terminal of said operational amplifier,
whereby a first portion including said gate electrode of said MOS transistor constitutes said voltage transfer means and a second portion including the rest of said MOS transistor constitutes said voltage-to-current converting circuit.

4. A waveform shaping circuit according to claim 3, wherein:
said clip circuit further includes at least one diode-connected additional MOS transistor,
said additional MOS transistor having a drain electrode-to-source electrode path connected in series with said drain electrode-to-source electrode path of said MOS transistor between said input terminal of said operational amplifier and said path of said MOS transistor.

5. A waveform shaping circuit according to claim 1, wherein:
said function circuit includes first and second supply voltage terminals;
said clip circuit including a current switch having a pair of first and second MOS transistors;
said current switch being connected between said first and second supply voltage terminals and said input terminal of said operational amplifier, said current switch having a first current path between one and the other of said first and second supply voltage terminals and a second current path between said one supply voltage terminal and said input terminal of said operational amplifier;
said first current path including a drain electrode to source electrode path of said first MOS transistor, said first MOS transistor having a gate electrode connected to said output terminal of said operational amplifier;
said second current path including a drain electrode to source electrode path of said second MOS transistor, said second MOS transistor having a gate electrode connected to receive said predetermined threshold;
said current switch being operative to open one of said first and second current paths depending on a relationship in magnitude between the voltage at said output terminal and said predetermined threshold,
whereby a first portion including said gate electrode of said first MOS transistor included in said current switch constitutes said voltage transfer means and a second portion including the rest of said current switch constitutes said voltage-to-current converting circuit.

6. A waveform shaping circuit according to claim 1, wherein a functional operation executed by said function circuit is one of inversion, addition, differentiation and integration.

7. A waveform shaping circuit according to claim 1, wherein said function circuit includes:
(a) a positive input terminal and a negative input terminal;
(b) a first input circuit connected between said positive input terminal and said inverting input terminal of said operational amplifier, and a second input circuit connected between said negative input terminal and said non-inverting input terminal of said operational amplifier; and
(c) a first feedback circuit connected between said non-inverting output terminal and said inverting input terminal of said operational amplifier, and a second feedback circuit connected between said inverting output terminal and said non-inverting input terminal of said operational amplifier.

8. A waveform shaping circuit according to claim 7, wherein:
said input circuit comprises a switched capacitor; and
said feedback circuit comprises a capacitor.

9. A circuit for preventing onset of instability in a high order delta sigma modulator which includes a plurality of integrators each including an input circuit, an integrating amplifier having an inverting input and a first output, and an integrating capacitor coupled between the inverting input and the first output, the circuit for preventing onset of instability comprising in combination:
(a) a first feedback circuit having an input coupled to the first output of a first integrating amplifier, the first feedback circuit having an output coupled to the inverting input of the first integrating amplifier;
(b) the first feedback circuit operating to apply negative feedback from the first output of the first integrating amplifier to the inverting input thereof in response to a voltage of the first output of the first integrating amplifier having a value outside of a predetermined range above or a predetermined range below a voltage of the inverting input,
wherein the first feedback circuit includes a waveform shaping circuit for use in a function circuit, the function circuit including an operational amplifier having a non-inverting input terminal, an inverting input terminal, a non-inverting output terminal, and an inverting output terminal, the waveform shaping circuit including
(A) first waveform shaping circuit connected to the non-inverting output terminal and the inverting input terminal; and
(B) second waveform shaping circuit connected to the inverting output terminal and the non-inverting input terminal, each of the first and second waveform shaping circuits including
- (a) voltage transfer means having an input connected to one of the inverting and non-inverting output terminals of the operational amplifier and an output electrically isolated from the input of the voltage transfer means, the voltage transfer means being operative to transfer the magnitude of a voltage at the one of the inverting and non-inverting output terminals of the operational amplifier from the input terminal of said voltage transfer means to the output of the voltage transfer means in an electrically isolated state; and
- (b) a voltage-to-current converting circuit having an input connected to the output of the voltage transfer means and an output connected to one of the inverting and non-inverting input terminals of the operational amplifier, the converting circuit having a predetermined threshold for the magnitude of the voltage at the one of the inverting and non-inverting output terminals of the operational amplifier, the converting circuit being operative to supply the one of the inverting and non-inverting input terminals of the operational amplifier with a current having a magnitude depending on a relationship in magnitude between the voltage at the one of said inverting and non-inverting output terminals of the operational amplifier received from the voltage transfer means and the predetermined threshold wherein the waveform shaping circuit comprises a limiter circuit composed of a pair of clip circuits, the pair of clip circuit of the limiter circuit having first and second predetermined thresholds, respectively, the first and second predetermined thresholds being different from each other.

10. The circuit of claim 9 wherein the first feedback circuit includes a first transistor having a first electrode coupled to the inverting input of the first integrating amplifier, a second electrode coupled to a first reference voltage, and a control electrode coupled to the first output of the first integrating amplifier.

11. The circuit of claim 10 wherein the first feedback circuit includes a second transistor having a first electrode coupled to the inverting input of the first integrating amplifier, a second electrode coupled to a second reference voltage, and a control electrode coupled to the first output of the first integrating amplifier.

12. The circuit of claim 11 wherein the first transistor is an N-channel MOSFET; and its first electrode is a source electrode, its second electrode is a drain electrode, and its control electrode is a gate electrode, and the second transistor is a P-channel MOSFET and its first electrode is a source electrode, its second electrode is a drain electrode, and its control electrode is a gate electrode.

13. The circuit of claim 12 wherein the input circuit of each of the integrators is a switched capacitor circuit, respectively.

14. The circuit of claim 13 where each of the integrators includes a feedback circuit substantially similar to the first feedback circuit.

15. The circuit of claim 14 wherein the plurality of integrators includes five integrators.

16. The circuit of claim 9 wherein the first integrating amplifier is a differential integrating amplifier also including a non-inverting input and a second output, a second feedback circuit substantially similar to the first feedback circuit coupled being between the non-inverted input and the second output.

17. A method for preventing onset of instability in a high order delta sigma modulator which includes a plurality of integrators, the method comprising the steps of:
- (a) providing an integrator which includes an integrating amplifier having an inverting input and an output,
- (b) providing a feedback circuit having an input coupled to the first output of the integrating amplifier, the feedback circuit having an output coupled to the inverting input of the integrating amplifier; and
- (c) operating the feedback circuit to (1) sense values of the voltage of the output of the integrating amplifier which are higher than a first threshold level or are lower than a second threshold level, wherein the first threshold level has a value sufficiently low to avoid instability of a positive-going output voltage of the integrating amplifier and the second threshold level has a value sufficiently high to avoid instability of a negative-going output voltage of the integrating amplifier, and (2) provide a negative feedback signal to the inverting amplifier representative of the amount by which the voltage of the output of the integrating amplifier either exceeds the first threshold level or is less than the second threshold level to prevent the voltage of the output of the integrating amplifier from attaining either a high or low unstable value.

18. The method of claim 17 wherein step (c) includes applying an output signal on the output of the integrating amplifier to a gate of an N-channel MOSFET and turning the N-channel MOSFET on if the output signal is greater than a voltage of the inverting input by an amount that exceeds a threshold voltage of the N-channel MOSFET, and supplying a negative feedback current through a source of the N-channel MOSFET to a conductor connected to the inverting input to apply a negative feedback signal to the inverting input and prevent the output signal from becoming unstable.

19. The method of claim 17 wherein step (c) includes applying an output signal on the output of the integrating amplifier to a gate of a P-channel MOSFET and turning the P-channel MOSFET on if the output signal is less than a voltage of the inverting input by an amount that exceeds a threshold voltage of the P-channel MOSFET, and supplying a negative feedback current through a source of the P-channel MOSFET from a conductor connected to the inverting input to apply a negative feedback signal to the inverting input, to thereby prevent the output signal from becoming unstable.

20. The method of claim 17 further including performing steps (a)–(c) for each of the plurality of integrators.

21. The method of claim 17 wherein the number of integrators exceeds two.

22. In a delta-sigma modulator including a plurality of integrators each including an input circuit, an integrating amplifier having an inverting input and an output, and an integrating capacitor coupled between the inverting input and the output, a circuit for preventing the onset of instability of the delta-sigma modulator, comprising:
- (a) a feedback circuit having an input coupled to the output of an integrating amplifier, the feedback circuit having an output coupled to the inverting input of the integrating amplifier;
- (b) the feedback circuit operating to apply negative feedback from the output of the integrating amplifier to the inverting input thereof in response to a voltage of the output of the integrating amplifier having a value outside of a predetermined range above or a predetermined range below a voltage of the inverting input;

(c) a threshold circuit in the feedback circuit, the threshold circuit including a first transistor having a first electrode coupled to the inverting input of the integrating amplifier, a second electrode coupled to a first reference voltage, and a control electrode coupled to the output of the integrating amplifier, and a second transistor having a first electrode coupled to the inverting input of the integrating amplifier, a second electrode coupled to a second reference voltage, and a control electrode coupled to the output of the integrating amplifier, wherein the feedback circuit operates to turn the first transistor on before the magnitude of the voltage of the output of the integrating amplifier attains an unstable value and prevents the voltage of the output of the integrating amplifier from attaining an unstable value, and wherein the feedback circuit also operates to turn the second transistor on before the magnitude of the voltage of the output of the integrating amplifier attains an unstable value and prevents the voltage of the output of the integrating amplifier from attaining an unstable value.

* * * * *